(12) United States Patent
Higashi et al.

(10) Patent No.: US 8,937,982 B2
(45) Date of Patent: Jan. 20, 2015

(54) SURFACE-EMITTING LASER ELEMENT, SURFACE-EMITTING LASER ARRAY, OPTICAL SCANNING APPARATUS, IMAGE FORMING APPARATUS, AND METHOD OF MANUFACTURING SURFACE-EMITTING LASER ELEMENT

(75) Inventors: Yasuhiro Higashi, Miyagi (JP); Kazuhiro Harasaka, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 179 days.

(21) Appl. No.: 13/258,596

(22) PCT Filed: May 26, 2010

(86) PCT No.: PCT/JP2010/059296
§ 371 (c)(1),
(2), (4) Date: Sep. 22, 2011

(87) PCT Pub. No.: WO2010/140600
PCT Pub. Date: Dec. 9, 2010

(65) Prior Publication Data
US 2012/0086765 A1    Apr. 12, 2012

(30) Foreign Application Priority Data

Jun. 4, 2009  (JP) .................. 2009-134907
Feb. 5, 2010  (JP) .................. 2010-023994

(51) Int. Cl.
*B41J 2/45* (2006.01)
*H01S 5/00* (2006.01)
(Continued)

(52) U.S. Cl.
CPC ........... *H01S 5/0042* (2013.01); *H01S 5/18313* (2013.01); *H01S 5/18333* (2013.01);
(Continued)

(58) Field of Classification Search
USPC ............... 347/238; 372/45.01, 46.01, 46.013, 372/50.12, 50.122, 50.124; 438/14, 16, 39
See application file for complete search history.

(56) References Cited

U.S. PATENT DOCUMENTS

| 5,493,577 A | 2/1996 | Choquette et al. |
| 7,417,777 B2 | 8/2008 | Saisho et al. |

(Continued)

FOREIGN PATENT DOCUMENTS

| EP | 1130720 A1 | 9/2001 |
| JP | 2004-22686 | 1/2004 |

(Continued)

OTHER PUBLICATIONS

International Search Report and Written Opinion in PCT/JP2010/059296.

(Continued)

*Primary Examiner* — Justin Seo
*Assistant Examiner* — Kendrick Liu
(74) *Attorney, Agent, or Firm* — Cooper & Dunham LLP

(57) ABSTRACT

A method of manufacturing a surface-emitting laser element having a light-emitting mesa structure with an emitting area including a high-reflectance portion and a low-reflectance portion includes forming a layered body that includes a lower reflecting mirror, a cavity structure, and an upper reflecting mirror on a substrate; forming a first area on an upper surface of the layered body; forming a second area having the same size as the first area on the upper surface of the layered body; forming a light-emitting mesa structure and a monitoring-mesa structure by etching the first area and the second area, respectively; forming a confinement structure including a current passage area surrounded by an oxide in the light-emitting mesa structure and the monitoring-mesa structure; and measuring the size of the current passage area of the monitoring-mesa structure.

16 Claims, 31 Drawing Sheets

(51) Int. Cl.
  *H01S 5/183* (2006.01)
  *H01S 5/42* (2006.01)
  *H04N 1/024* (2006.01)
  *H01S 5/028* (2006.01)
  *H01S 5/042* (2006.01)
  *H01S 5/32* (2006.01)
  *H01S 5/343* (2006.01)

(52) U.S. Cl.
  CPC ............ *H01S5/18338* (2013.01); *H01S 5/423* (2013.01); *H04N 1/024* (2013.01); *H01S 5/18355* (2013.01); *H01S 2301/166* (2013.01); *H01S 5/0282* (2013.01); *H01S 5/0425* (2013.01); *H01S 5/1835* (2013.01); *H01S 5/3202* (2013.01); *H01S 5/3434* (2013.01); *H01S 5/3436* (2013.01); *H01S 2301/176* (2013.01)
  USPC ............ 372/46.013; 372/45.01; 372/50.122; 372/50.124; 347/238

(56) References Cited

U.S. PATENT DOCUMENTS

| | | |
|---|---|---|
| 2003/0139060 A1 | 7/2003 | Sai |
| 2004/0008747 A1* | 1/2004 | Nakayama et al. ............ 372/46 |
| 2004/0042519 A1 | 3/2004 | Sakamoto et al. |
| 2005/0169336 A1* | 8/2005 | Ishii et al. ................. 372/50 |
| 2005/0180476 A1 | 8/2005 | Sakamoto et al. |
| 2005/0180478 A1 | 8/2005 | Sakamoto et al. |
| 2006/0093006 A1 | 5/2006 | Jikutani |
| 2007/0014324 A1* | 1/2007 | Maeda et al. ............... 372/46.01 |
| 2009/0032908 A1* | 2/2009 | Masui et al. ................ 257/623 |
| 2009/0091805 A1* | 4/2009 | Tanabe et al. ............... 358/475 |
| 2009/0129417 A1 | 5/2009 | Maeda et al. |
| 2009/0285252 A1 | 11/2009 | Ishii et al. |
| 2009/0285602 A1 | 11/2009 | Harasaka et al. |
| 2009/0295902 A1 | 12/2009 | Sato et al. |
| 2009/0310632 A1 | 12/2009 | Sugawara et al. |

FOREIGN PATENT DOCUMENTS

| | | |
|---|---|---|
| JP | 2004-95934 | 3/2004 |
| JP | 3566902 | 6/2004 |
| JP | 2006-100858 | 4/2006 |
| JP | 2006-210429 | 8/2006 |
| JP | 3965801 | 6/2007 |
| JP | 2008-16824 | 1/2008 |
| JP | 2008-53353 | 3/2008 |
| JP | 2008-78612 | 4/2008 |
| WO | WO2008/023813 A1 | 2/2008 |

OTHER PUBLICATIONS

Korean official action dated Apr. 16, 2013 (including English translation) in corresponding Korean patent application No. 10-2011-7028816.

Taiwanese official action dated Mar. 21, 2013 (including English translation) in corresponding Taiwanese patent application.

European Search Report dated Aug. 13, 2013 in corresponding European patent application no. 10 783 382.4.

Japanese official action dated Mar. 25, 2014 in corresponding Japanese patent application No. 2010-023994.

\* cited by examiner

FIG.22
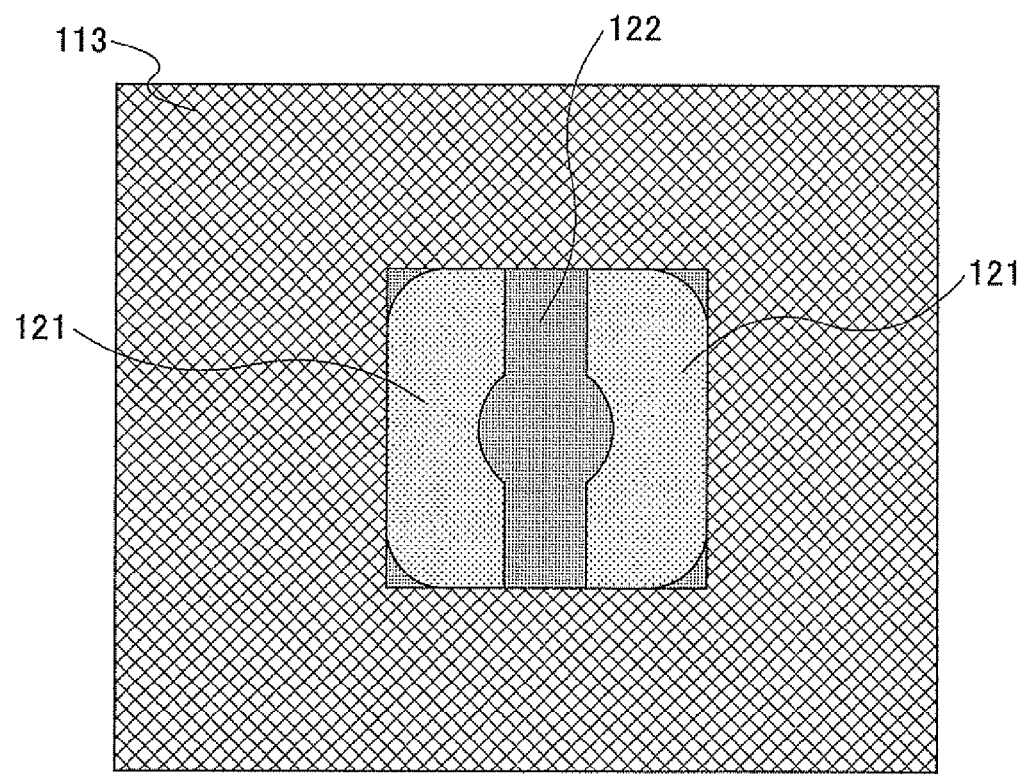
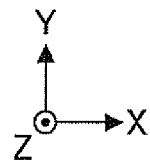

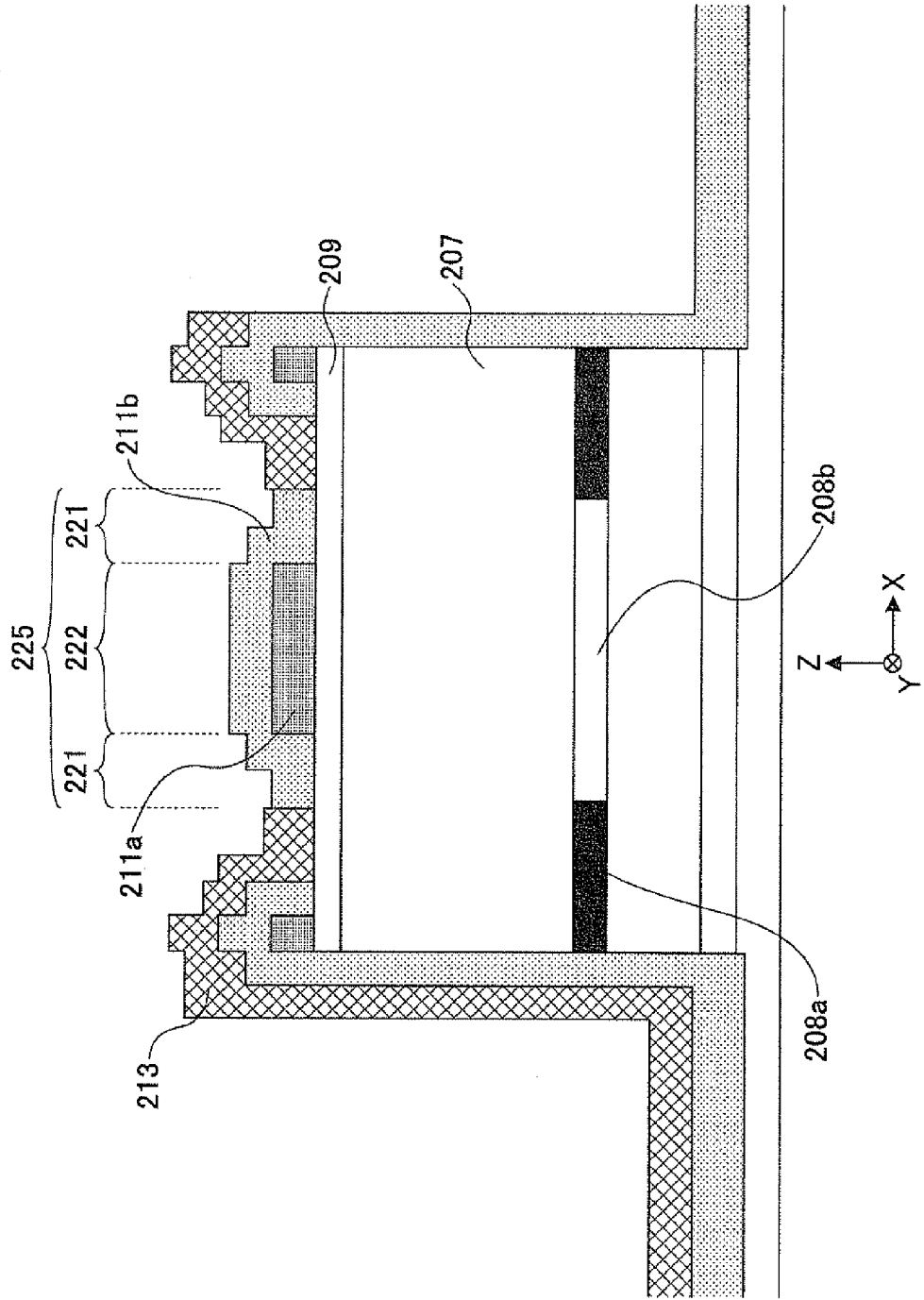

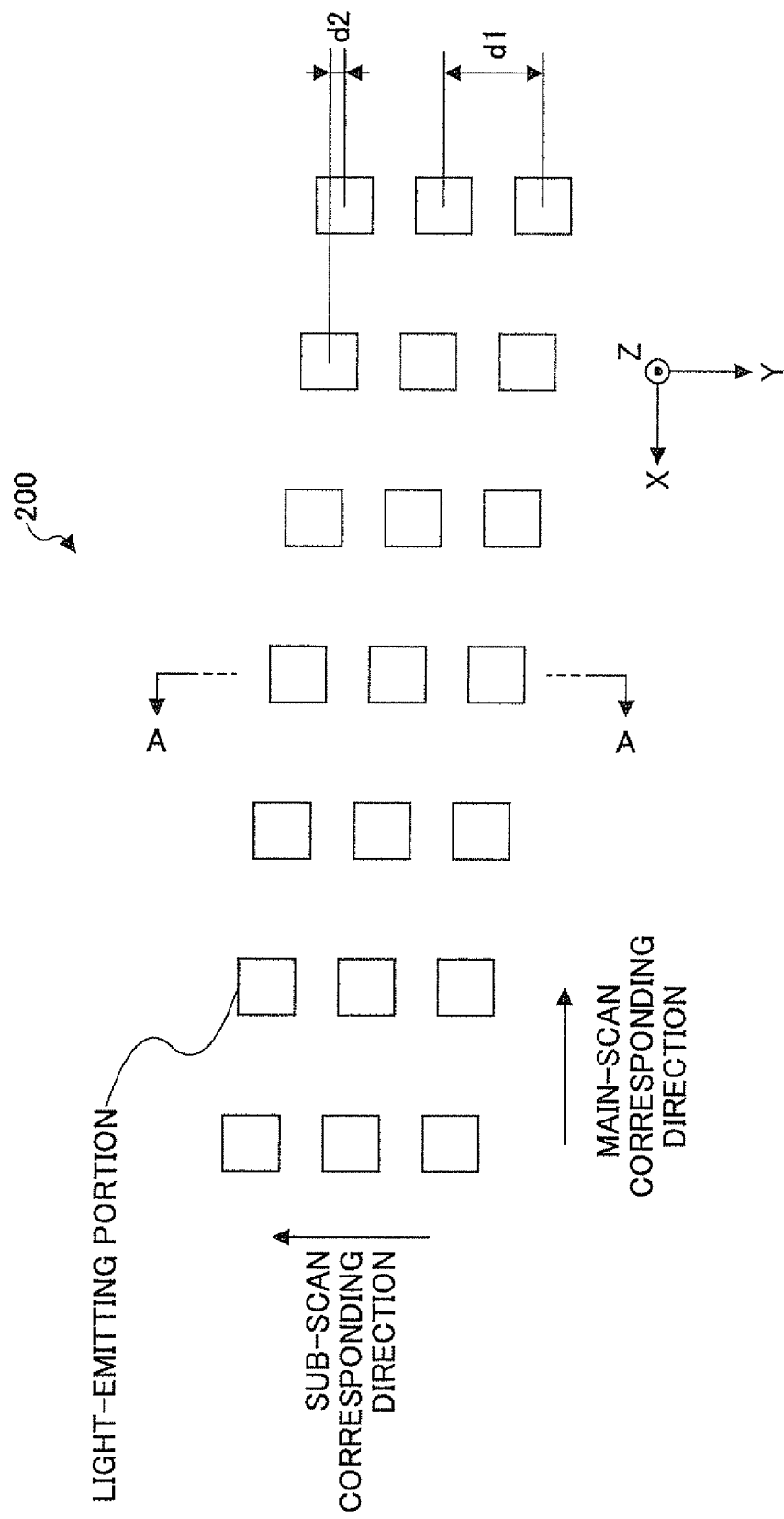

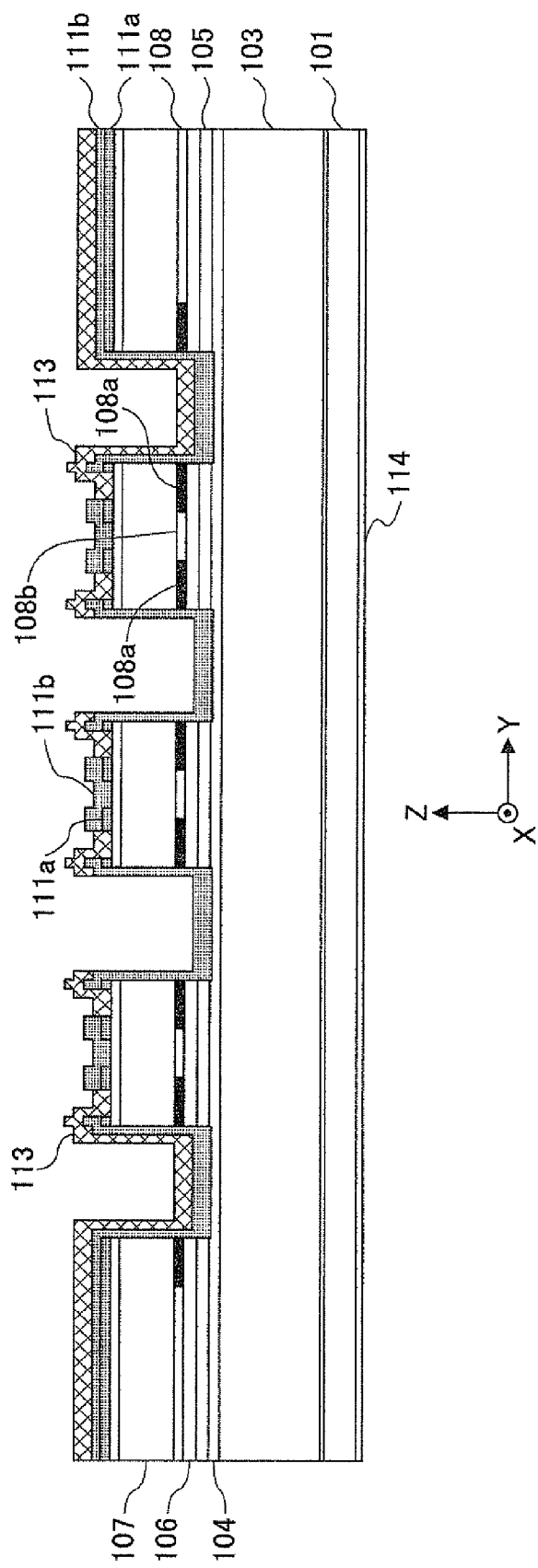

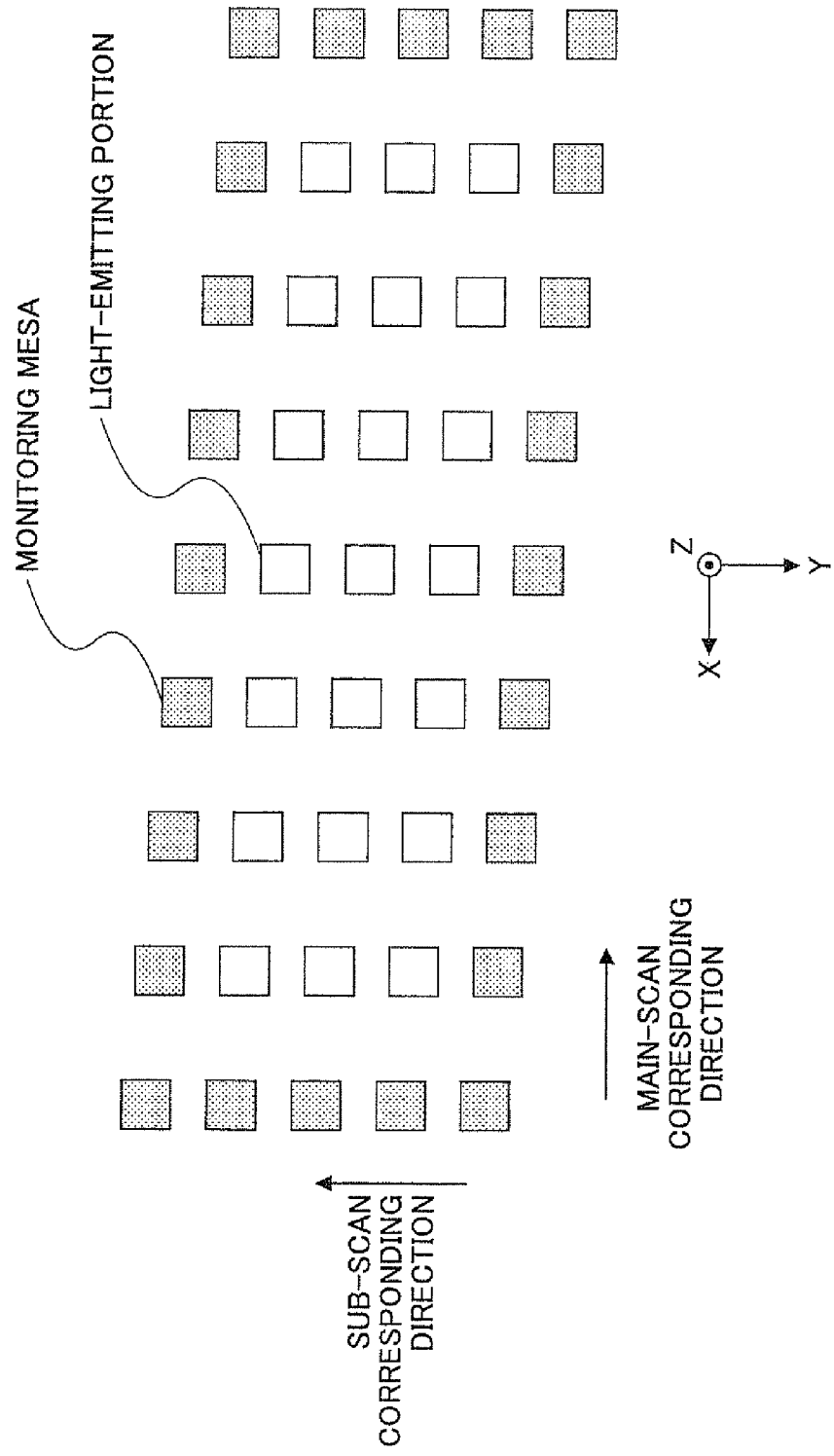

SURFACE-EMITTING LASER ELEMENT, SURFACE-EMITTING LASER ARRAY, OPTICAL SCANNING APPARATUS, IMAGE FORMING APPARATUS, AND METHOD OF MANUFACTURING SURFACE-EMITTING LASER ELEMENT

TECHNICAL FIELD

The present invention generally relates to surface-emitting laser elements, surface-emitting laser arrays, optical scanning apparatuses, image forming apparatuses, and methods of manufacturing a surface-emitting laser element. More particularly, the present invention relates to a surface-emitting laser element and a surface-emitting laser array both of which are configured to emit laser light in a direction perpendicular to a substrate. The present invention also relates to an optical scanning apparatus having the surface-emitting laser element or the surface-emitting laser array, an image forming apparatus having the optical scanning apparatus, and a method of manufacturing a surface-emitting laser element configured to emit laser light in a direction perpendicular to a substrate.

BACKGROUND ART

A vertical cavity surface-emitting laser (VCSEL) element emits light in a direction perpendicular to a substrate of the element. VCSEL elements are gaining increasing attention because they are superior to edge-emitting semiconductor laser elements in terms of cost, power consumption, size, suitability for two-dimensional devices, and performance. The edge-emitting semiconductor laser elements emit light in a direction parallel to a substrate.

A surface-emitting laser element typically includes a confinement structure for improving current inflow efficiency. The confinement structure may be formed by selective oxidation of Al (aluminum) and As (arsenic) layers (which may be hereafter referred to as an "oxidized confinement structure"; see Patent Document 1, for example). Specifically, a mesa of a predetermined size having a to-be-selectively oxidized layer of p-AlAs exposed on the sides is formed. The mesa is then placed in a high-temperature water-vapor atmosphere so as to selectively oxidize Al from the sides, thereby leaving an area of the selectively oxidized layer at the center of the mesa that is not oxidized. The un-oxidized area forms a current passage area through which a drive current for the surface-emitting laser element passes. In this way, a current confinement structure can be readily obtained.

The refractive index of the Al oxidized ($Al_xO_y$) layer (which may be hereafter referred to as an "oxidized layer") is about 1.6, which is lower than the refractive index of a semiconductor layer. As a result, a refractive index difference is caused in a lateral direction of the cavity structure, so that light can be confined in the central portion of the mesa. In this way, the light-emitting efficiency can be improved, and advantageous properties such as a low threshold current value and high efficiency can be realized.

A surface-emitting laser element may be utilized as a light source in an optical system of a printer (with an oscillating wavelength in a 780 nm band); a light source for writing in an optical disk unit (with an oscillating wavelength in a 780 nm or a 850 nm band); or a light source in an optical transmission system, such as a LAN (Local Area Network) using optical fibers (with an oscillating wavelength in a 1.3 μm or a 1.5 μm band). The surface-emitting laser element may also be utilized as a light source for optical transmission between or within boards, between LSI (Large Scale Integrated circuit) chips, or within an LSI chip.

In these fields of application, the light emitted by the surface-emitting laser element (which may be hereafter referred to as "emitted light") is often required to have a circular cross-sectional shape. In order to obtain a circular cross-sectional shape of emitted light, high-order lateral mode oscillation needs to be prevented.

For example, Patent Document 2 discusses a technique for controlling lateral mode oscillation by forming an optically transparent film on an output surface and providing a reflectance difference between a central portion and a peripheral portion of a light-emitting area.

Single mode output is greatly influenced by the size of the current passage area. When surface-emitting laser elements are mass-produced by layering plural semiconductor layers on a substrate having a large area measuring 3 or 4 inches in diameter, for example, variations may be caused in the size of the current passage areas in the plane of a layered body of the semiconductor layers depending on a temperature distribution or water-vapor flow conditions.

Patent Document 3 discloses a surface-emitting laser array apparatus in which dummy elements that are not actually used as surface-emitting laser elements are disposed around a two-dimensional array of surface-emitting laser elements that are actually used. The dummy elements have the same post structure as the actually used surface-emitting laser elements. In this surface-emitting laser array apparatus, the distance between adjacent surface-emitting laser elements, the distance between adjacent dummy elements, and the distance between the surface-emitting laser elements and the adjacent dummy elements are made uniform.

However, the condition of layering of the semiconductor layers may differ among a plurality of layered bodies. Thus, variations may be caused in the size of the current passage area among the plural layered bodies even if their to-be-selectively oxidized layers are selectively oxidized under the same oxidizing conditions (including temperature and duration of the oxidizing process).

Patent Document 1: U.S. Pat. No. 5,493,577
Patent Document 2: Japanese Patent No. 3566902
Patent Document 3: Japanese Patent No. 3965801

SUMMARY OF THE INVENTION

The disadvantages of the prior art may be overcome by the present invention which, in one aspect, is a surface-emitting laser element including a substrate, a light-emitting mesa structure, and a monitoring mesa-structure disposed near the light-emitting mesa structure. The light-emitting mesa structure includes a lower reflecting mirror, a cavity structure including an active layer, and an upper reflecting mirror having a confinement structure in which a current passage area is surrounded by an oxide. An emitting area of the light-emitting mesa structure includes a high reflectance portion and a low reflectance portion. The monitoring-mesa structure is configured to monitor the size of the current passage area.

In another aspect of the present invention, a surface-emitting laser array includes a plurality of the surface-emitting laser elements.

In another aspect of the present invention, an optical scanning apparatus for scanning a scanned surface with light includes a light source including the surface-emitting laser element; a deflector configured to deflect light emitted by the light source; and a scanning optical system configured to focus the light deflected by the deflector onto the scanned surface.

In another aspect of the present invention, an optical scanning apparatus for scanning a scanned surface with light includes a light source includes the surface-emitting laser array; a deflector configured to deflect light emitted by the light source; and a scanning optical system configured to focus the light deflected by the deflector onto the scanned surface.

In another aspect of the present invention, an image forming apparatus includes an image carrier, and the optical scanning apparatus configured to scan the image carrier with light modulated in accordance with image information.

In another aspect, the present invention provides a method of manufacturing a surface-emitting laser element comprising a light-emitting mesa structure having an emitting area including a high-reflectance portion and a low-reflectance portion. The method includes a step of forming a layered body. The layered body includes a lower reflecting mirror, a cavity structure including an active layer, and an upper reflecting mirror having a selectively oxidized layer on a substrate. The method further includes forming a first area on an upper surface of the layered body, in which first area an optically transparent film having an optical thickness corresponding to an odd multiple of $\lambda/4$ is partially layered, wherein $\lambda$ is an oscillating wavelength. The method also includes forming a second area having the same size as the first area on the upper surface of the layered body, in which second area no optically transparent film is layered or an optically transparent film is layered to a uniform thickness. The method further includes etching areas around the first area and the second area from the top of the layered body in order to form a light-emitting mesa structure and a monitoring-mesa structure corresponding to the first area and the second area, respectively, thus exposing at least the selectively oxidized layer on a lateral surface of the light-emitting mesa structure and the monitoring-mesa structure. The method further includes selectively oxidizing the selectively oxidized layer from the lateral surface of the light-emitting mesa structure and the monitoring-mesa structure in order to form a confinement structure in the light-emitting mesa structure and the monitoring-mesa structure. The confinement structure includes a current passage area surrounded by an oxide.

BRIEF DESCRIPTION OF THE DRAWINGS

These and other aspects of the invention will become apparent from the following description of the preferred embodiments taken in conjunction with the following drawings in which:

FIG. 22 is a plan view of FIG. 21;

FIG. 27 is an enlarged cross-sectional view of a surface-emitting laser element according to another embodiment illustrated in FIG. 25;

FIG. 31 illustrates a surface-emitting laser array 200 according to an embodiment of the present invention;

FIG. 32 is a cross section taken along line A-A of FIG. 31;

FIG. 33 illustrates a surface-emitting laser array according to an embodiment of the present invention.

BEST MODE OF CARRYING OUT THE INVENTION

Image Forming Apparatus

Figure 1:
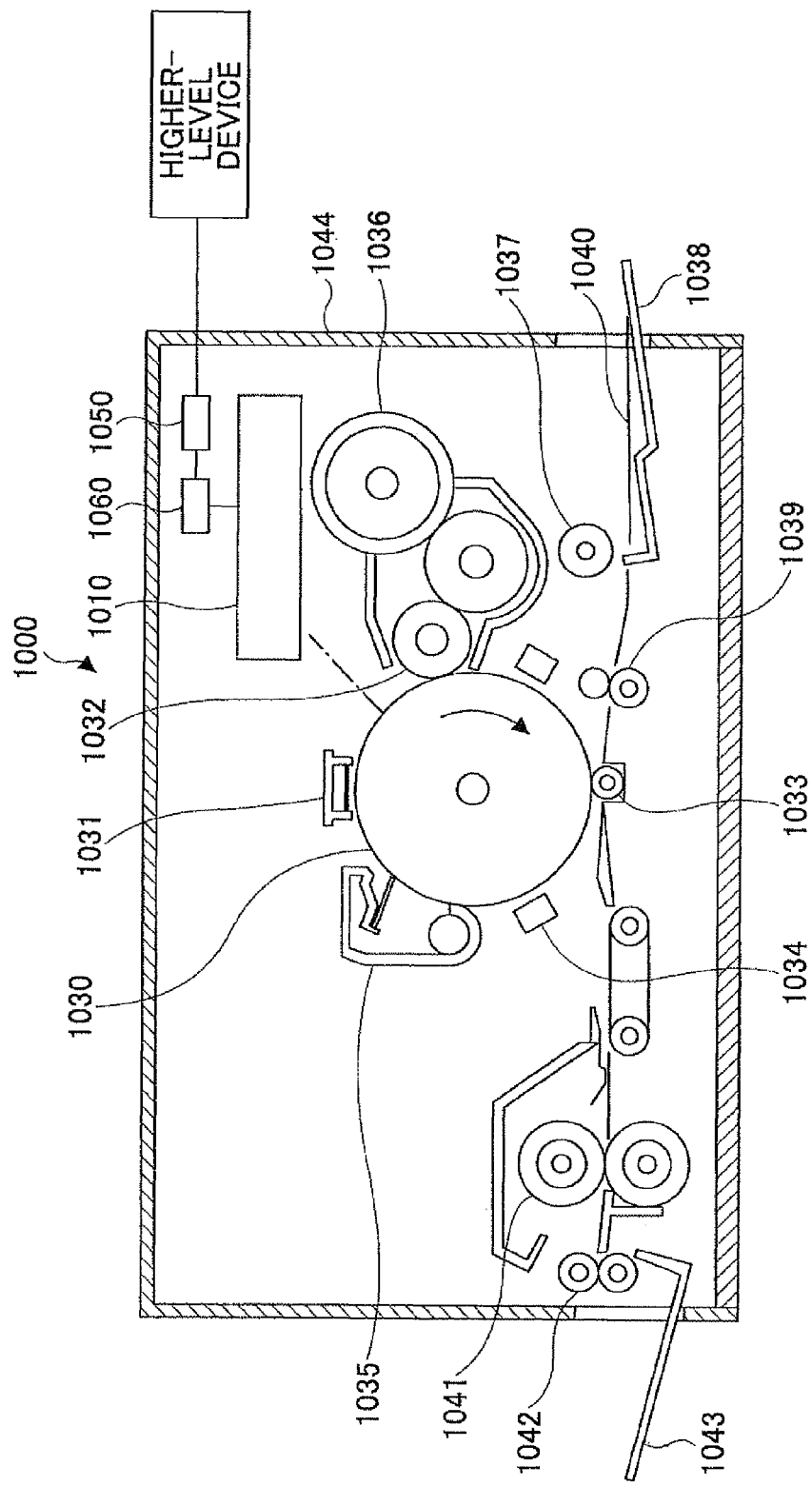
FIG. 1 illustrates a structure of a laser printer 1000 according to an embodiment of the present invention.

Hereafter, various embodiments of the present invention are described with reference to the drawings. FIG. 1 is a schematic illustration of a laser printer 1000 (image forming apparatus) according to an embodiment of the present invention. The laser printer 1000 includes an optical scanning apparatus 1010; a photosensitive drum 1030; a charger 1031; a developing roller 1032; a transfer charger 1033; a neutralizing unit 1034; a cleaning unit 1035; a toner cartridge 1036; a sheet feeding roller 1037; a sheet feeding tray 1038; a registration roller pair 1039; a fusing roller 1041; a sheet-ejecting roller 1042; an ejected sheet tray 1043; a communication control unit 1050; and a printer control unit 1060 configured to control the above various units of the laser printer 1000. These various units may be installed at predetermined positions within a printer casing 1044.

The communication control unit 1050 may be configured to control bi-directional communications with a higher-level apparatus (such as a personal computer) via a network. The photosensitive drum 1030 is a cylindrical member on a surface of which a photosensitive layer is formed. The surface of the photosensitive drum 1030 provides a scanned surface. The photosensitive drum 1030 is configured to be rotated in a direction indicated by an arrow shown on the photosensitive drum 1030 in FIG. 1.

The charger 1031, the developing roller 1032, the transfer charger 1033, the neutralizing unit 1034, and the cleaning unit 1035 are disposed near and along the circumferential surface of the photosensitive drum 1030. The charger 1031 is configured to charge the surface of the photosensitive drum 1030 uniformly. The optical scanning apparatus 1010 is configured to scan the charged surface of the photosensitive drum 1030 with a beam of light modulated in accordance with image information sent from the higher-level apparatus, thus forming a latent image on the surface of the photosensitive drum 1030 corresponding to the image information. The latent image is moved in the direction of the developing roller 1032 as the photosensitive drum 1030 rotates. The structure of the optical scanning apparatus 1010 is described later.

The toner cartridge 1036 contains toner that is supplied to the developing roller 1032. The developing roller 1032 attaches the toner supplied from the toner cartridge 1036 onto the latent image on the surface of the photosensitive drum 1030, thus making the image information visible. As the photosensitive drum 1030 further rotates, the toner-attached latent image (which may be hereafter referred to as a "toner image") is moved towards the transfer charger 1033.

The sheet feeding tray 1038 contains a number of sheets of recording paper 1040. The sheet feeding roller 1037 is installed near the sheet feeding tray 1038 and configured to pick out the recording paper 1040 from the sheet feeding tray 1038 one sheet at a time and send it to the registration roller pair 1039. The registration roller pair 1039 holds the recording paper 1040 once and then sends it out into a gap between the photosensitive drum 1030 and the transfer charger 1033 in accordance with the rotation of the photosensitive drum 1030.

The transfer charger 1033 is supplied with a voltage of an opposite polarity to the toner in order to electrically draw the toner on the surface of the photosensitive drum 1030 towards the recording paper 1040. As a result, the toner image on the surface of the photosensitive drum 1030 is transferred onto the recording paper 1040. The recording paper 1040 with the transferred toner image is then sent to the fusing roller 1041. The fusing roller 1041 applies heat and pressure to the recording paper 1040 in order to fuse the toner on the recording paper 1040. The thus fused recording paper 1040 is then sent out into the ejected sheet tray 1043 and stacked therein via the sheet-ejecting roller 1042.

After the above printing operation, the surface of the photosensitive drum 1030 is neutralized by the neutralizing unit 1034. Thereafter, the toner remaining on the surface of the photosensitive drum 1030 is removed by the cleaning unit 1035. After the remaining toner is removed, the surface of the photosensitive drum 1030 is again positioned opposite the charger 1031 as the photosensitive drum 1030 rotates.

Optical Scanning Apparatus

Figure 2:
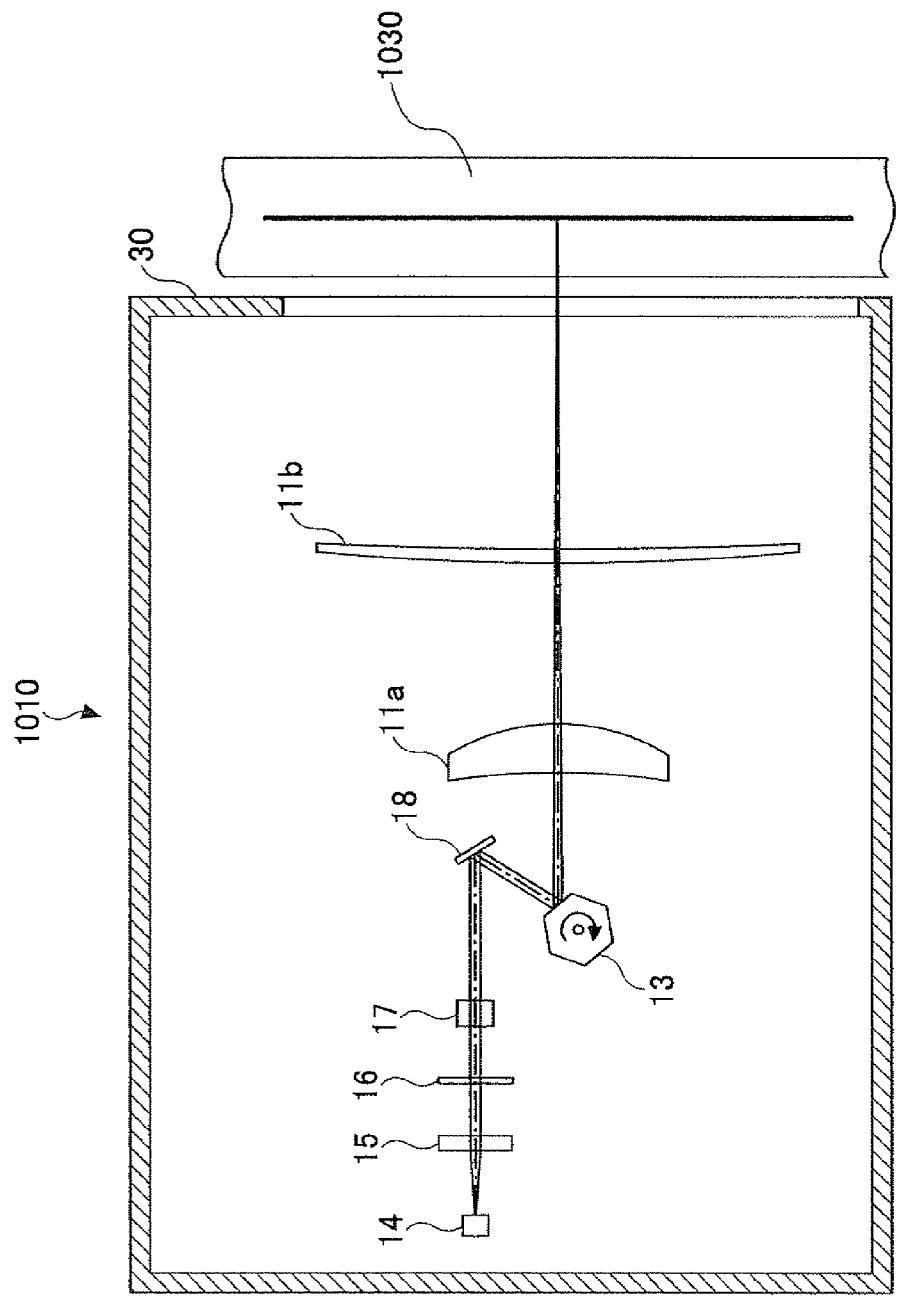
FIG. 2 illustrates an optical scanning apparatus 1010 of the laser printer 1000 illustrated in FIG. 1.

Next, the structure of the optical scanning apparatus 1010 according to an embodiment of the present invention is described with reference to FIG. 2. In the illustrated embodiment, the optical scanning apparatus 1010 includes a deflector-side scanning lens 11a; an image-side scanning lens 11b; a polygonal mirror 13; a light source 14; a coupling lens 15; an aperture plate 16; a cylindrical lens 17; a reflecting mirror 18; and a scan control unit (not shown). These elements of the optical scanning apparatus 1010 are installed at predetermined positions in a housing 30.

In the following description, a direction corresponding to a main-scan direction may be referred to as a "main-scan corresponding direction", and a direction corresponding to a sub-scan direction may be referred to as a "sub-scan corresponding direction". The coupling lens 15 is configured to make a light beam emitted by the light source 14 into substantially parallel light. The aperture plate 16 has an aperture that defines the diameter of the light beam that has passed through the coupling lens 15. The light beam that has passed through the aperture of the aperture plate 16 is focused, with respect to the sub-scan corresponding direction, near a deflecting/reflecting surface of the polygonal mirror 13 via the reflecting mirror 18, by the cylindrical lens 17.

An optical system disposed on an optical path between the light source 14 and the polygonal mirror 13 may be referred to as a pre-deflector optical system. In the present embodiment, the pre-deflector optical system includes the coupling lens 15, the aperture plate 16, the cylindrical lens 17, and the reflecting mirror 18. The polygonal mirror 13 may include six mirror surfaces and have an inscribed circle radius of 18 mm, each of the six mirrors providing the deflecting/reflecting surface. The polygonal mirror 13 is configured to deflect the light beam from the reflecting mirror 18 while rotating at a constant velocity about an axis parallel to the sub-scan corresponding direction.

The deflector-side scanning lens 11a is disposed on an optical path of the light beam deflected by the polygonal mirror 13. The image-side scanning lens 11b is disposed on an optical path of the light beam that has passed through the deflector-side scanning lens 11a. The light beam that has passed through the image-side scanning lens 11b irradiates the surface of the photosensitive drum 1030, forming a light spot on the surface. The light spot moves along the longitudinal direction of the photosensitive drum 1030 as the polygonal mirror 13 rotates, thus scanning the photosensitive drum 1030. This direction of movement of the light spot corresponds to the main-scan direction. The direction of rotation of the photosensitive drum 1030 corresponds to the sub-scan direction.

The optical system disposed on an optical path between the polygonal mirror 13 and the photosensitive drum 1030 may be referred to as a "scanning optical system". In the present embodiment, the scanning optical system includes the deflector-side scanning lens 11*a* and the image-side scanning lens 11*b*. Preferably, at least one folding mirror may be disposed in the optical path between the deflector-side scanning lens 11*a* and the image-side scanning lens 11*b*, or in the optical path between the image-side scanning lens 11*b* and the photosensitive drum 1030.

Surface-Emitting Laser Element

Figure 3:
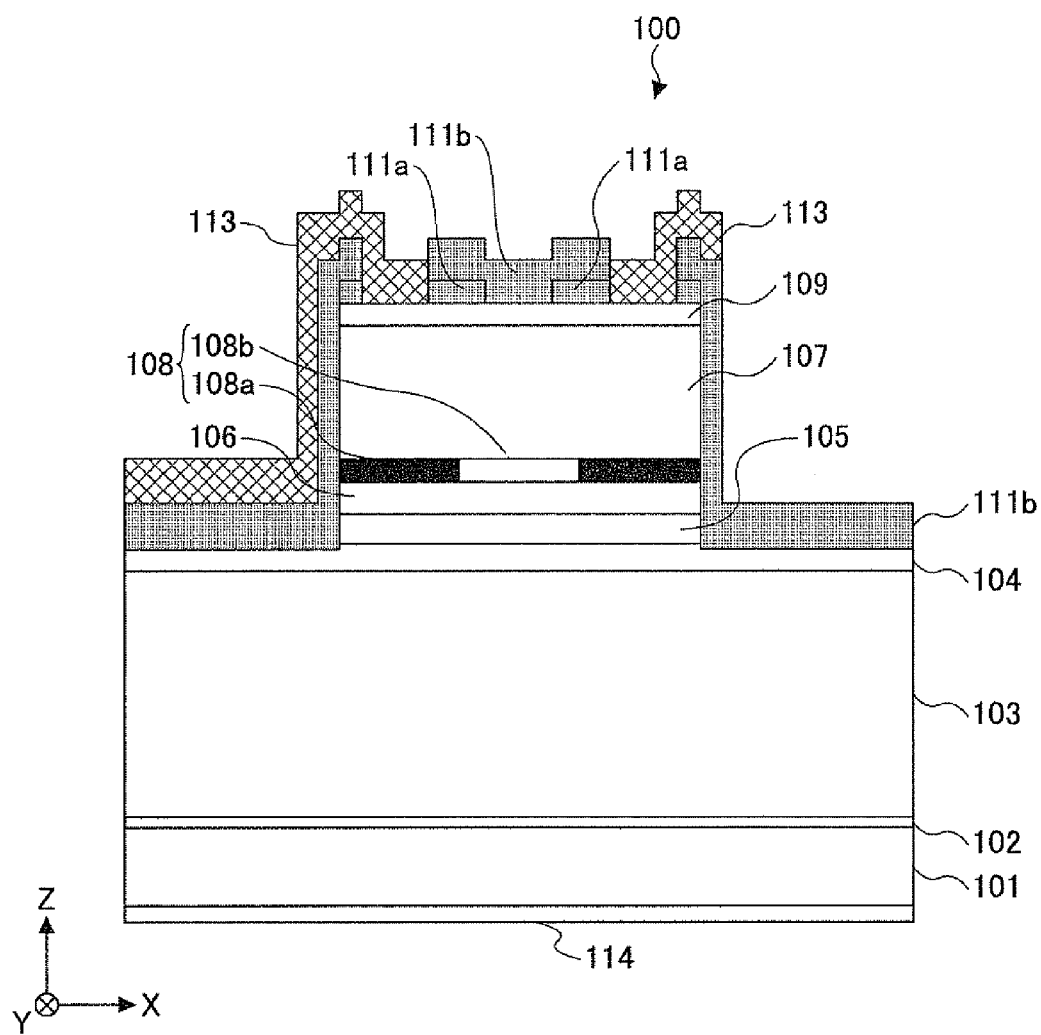
FIG. 3 is a cross section of a surface-emitting laser element 100 included in a light source 14 of the optical scanning apparatus 1010 illustrated in FIG. 4.

The light source 14 may include a surface-emitting laser element 100 as illustrated in FIG. 3.

In the present disclosure, laser oscillation occurs in a Z-axis direction. Two directions perpendicular to each other in a plane perpendicular to the Z-axis direction are referred to as an X-axis direction and a Y-axis direction. FIG. 3 is a cross section of the surface-emitting laser element 100 taken along an X-Z plane.

The surface-emitting laser element 100 includes a substrate 101; a buffer layer 102; a lower semiconductor DBR 103; a lower spacer layer 104; an active layer 105; an upper spacer layer 106; an upper semiconductor DBR 107; and a contact layer 109. The surface-emitting laser element 100 may have an oscillating wavelength in a 780 nm band.

Figure 4A:
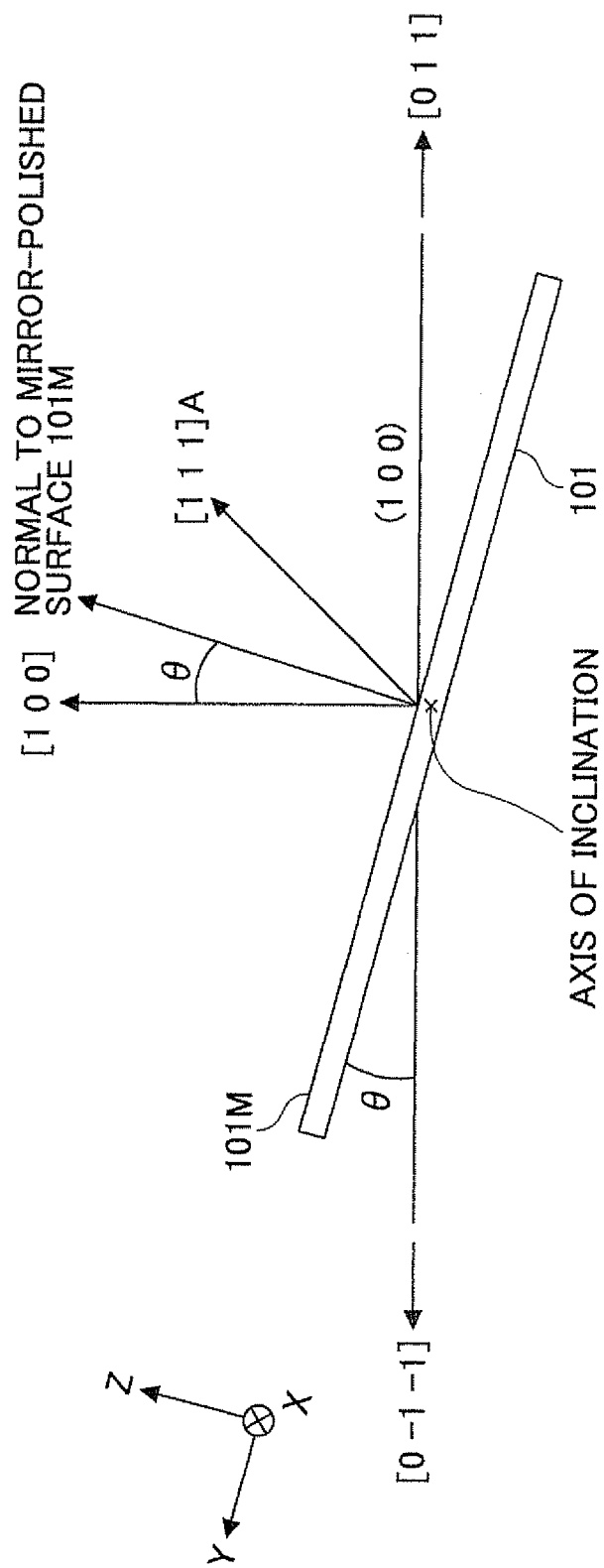
FIG. 4A illustrates a substrate 101 of the surface-emitting laser element 100 of FIG. 3 illustrating an inclination of the substrate 101.
Figure 4B:
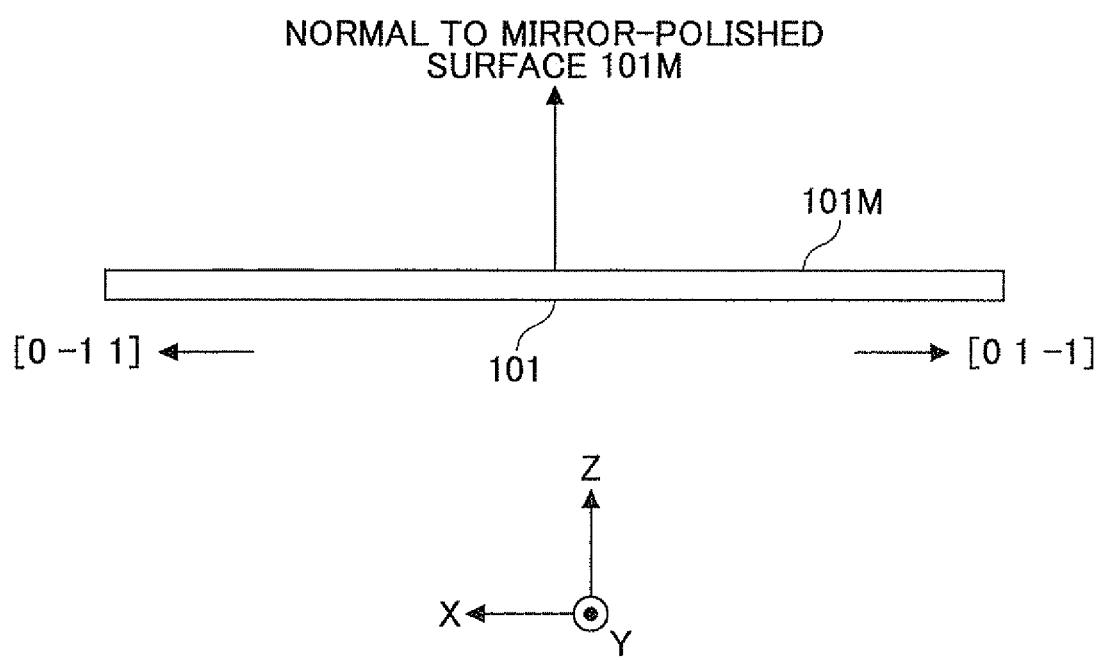
FIG. 4B illustrates the substrate 101 seen from a Y-axis direction.

Referring to FIG. 4A, a n-GaAs single-crystal substrate 101 has a mirror-polished surface (principal surface). A normal to the mirror-polished surface is inclined from a crystal orientation [1 0 0] in the direction of a crystal orientation [1 1 1] A by an angle θ of 15 degrees. Thus, the substrate 101 is a so-called inclined substrate. As illustrated in FIG. 4B, a crystal orientation [0 −1 1] is in a +X direction, and a crystal orientation [0 1 −1] is in a −X direction.

Referring to FIG. 3, the buffer layer 102 is a n-GaAs layer layered on the +Z side of the substrate 101. The lower semiconductor DBR 103 is layered on the +Z side of the buffer layer 102 and includes 40.5 pairs of low-refraction index layers of n-AlAs and high-refraction index layers of n-Al0.3Ga0.7As. Between the individual refraction index layers, there are graded composition layers with a thickness of 20 nm in which the composition is gradually varied from one composition to another for electric resistance decreasing purpose. Each of the refraction index layers has an optical thickness of λ/4 including ½ of an adjacent graded composition layer, where λ is an oscillating wavelength. When the optical thickness is λ/4, an actual thickness D of that layer may be λ/4n (where n is a refractive index of the medium of the layer). The lower spacer layer 104 is layered on the +Z side of the lower semiconductor DBR 103 and comprises a non-doped (Al0.1Ga0.9)0.5In0.5P layer. The active layer 105 is layered on the +Z side of the lower spacer layer 104 and has a triple quantum well structure having three quantum well layers and four barrier layers. Each quantum well layer comprises a GaInAsP composition configured to induce a 0.7% compression strain, and has a bandgap wavelength of about 780 nm. Each barrier layer comprises a GaInP composition configured to induce a 0.6% tensile strain.

The upper spacer layer 106 is layered on the +Z side of the active layer 105 and comprises a non-doped (Al0.1Ga0.9)0.5In0.5P layer. The portion including the lower spacer layer 104, the active layer 105, and the upper spacer layer 106 may be referred to as a cavity structure whose thickness is set to correspond to the optical thickness of the oscillating wavelength. The active layer 105 is disposed at the center of the cavity structure corresponding to an anti-node of a standing wave distribution of an electric field so that a high probability of induced emission can be obtained.

The upper semiconductor DBR 107 includes a first upper semiconductor DBR and a second upper semiconductor DBR. The first upper semiconductor DBR is layered on the +Z side of the upper spacer layer 106 and may comprise a pair of a p-(Al0.7Ga0.3)0.5In0.5P low-refraction index layer and a p-(Al0.1Ga0.9)0.5In0.5P high-refraction index layer. The second upper semiconductor DBR is layered on the +Z side of the first upper semiconductor DBR and may comprise 23 pairs of p-Al0.9Ga0.1As low-refraction index layers and p-Al0.3Ga0.7As high-refraction index layers.

Between the refraction index layers in the upper semiconductor DBR 107, graded composition layers are disposed in which the composition is gradually varied from one composition to another composition, in order to reduce electric resistance. Each refraction index layer has an optical thickness of λ/4 including ½ of an adjacent graded composition layer.

The second upper semiconductor DBR includes a to-be-selectively oxidized layer 108 of p-AlAs with a thickness of 30 nm. The to-be-selectively oxidized layer 108 is disposed at a position corresponding to the third node, from the active layer 105, of a standing wave distribution of an electric field. The contact layer 109 is layered on the +Z side of the upper semiconductor DBR 107 and comprises a p-GaAs layer.

Method of Manufacturing Surface-Emitting Laser Element 100

Next, a method of manufacturing the surface-emitting laser element 100 is described.

Figure 5A:
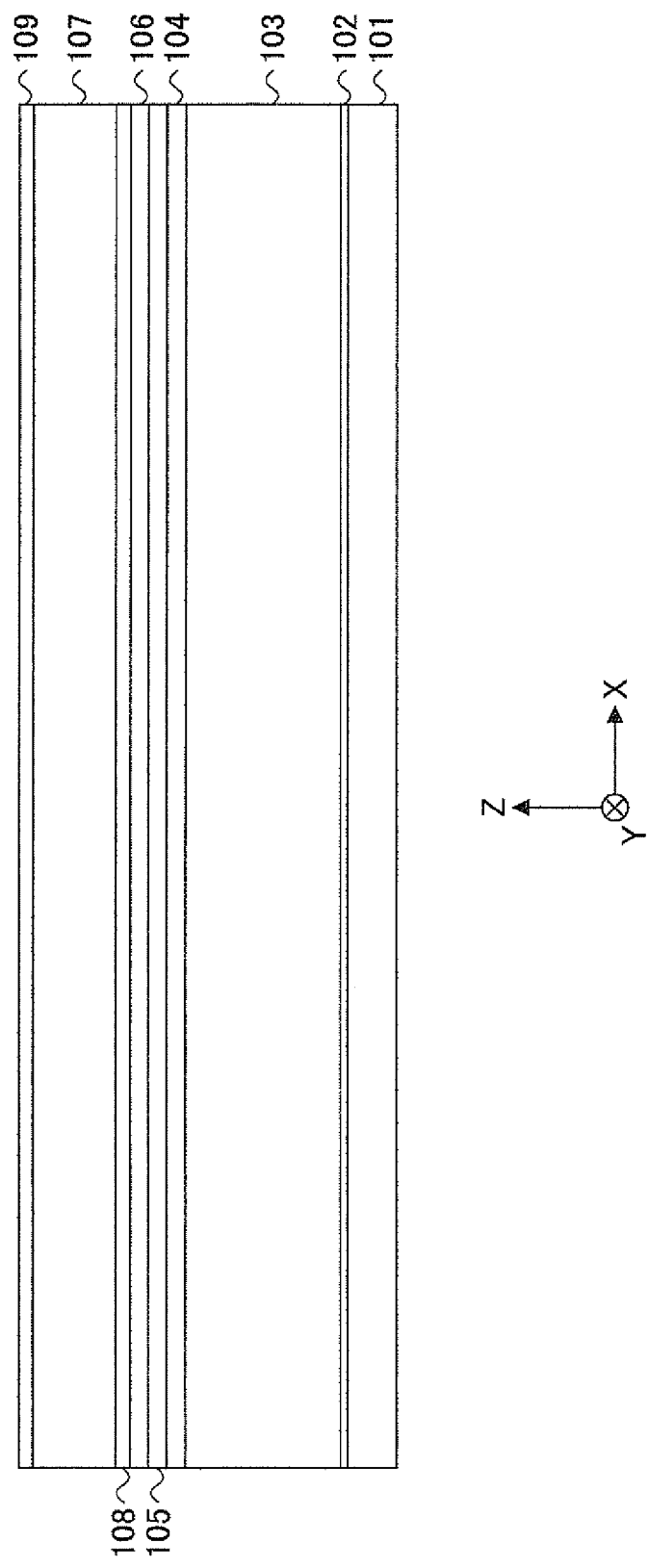
FIG. 5A is a cross section illustrating a step in a process of manufacturing a surface-emitting laser element.

(1-1) The plural semiconductor layers described above are layered on the substrate 101 by a crystal growth technology, such as metal organic chemical vapor deposition (MOCVD) or molecular beam epitaxy (MBE), thus forming a layered body (see FIG. 5A).

As a Group III material, trimethylaluminium (TMA), trimethylgallium (TMG) or trimethyl indium (TMI) may be used. As a Group V material, phosphine (PH3) or arsine (AsH3) may be used. As a p-type dopant material, carbon tetrabromide (CBr4) or dimethylzinc (DMZn) may be used, and as an n-type dopant material, hydrogen selenide (H2Se) may be used.

Figure 5B:
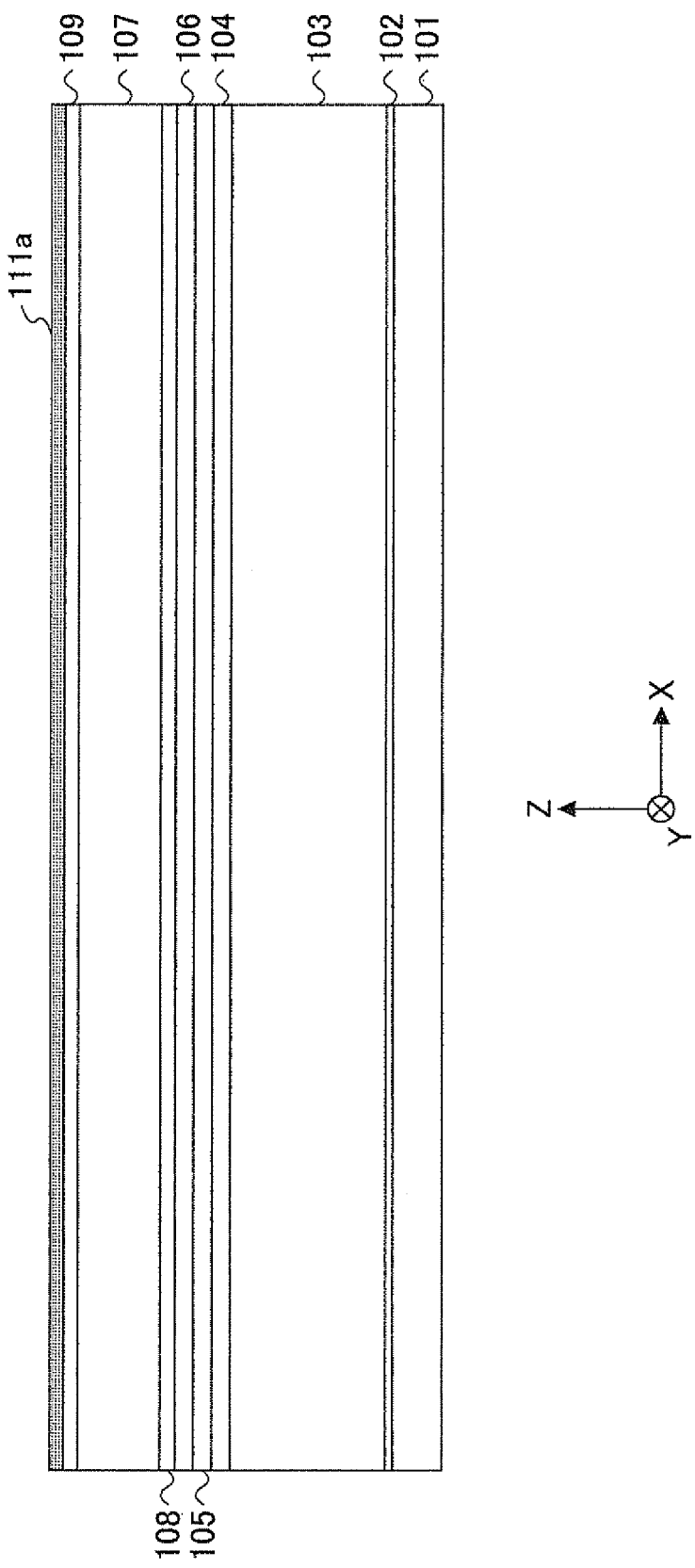
FIG. 5B is a cross section illustrating another step in the process of manufacturing the surface-emitting laser element.

(1-2) Using CVD, a SiN dielectric layer 111*a* is formed (see FIG. 5B). The dielectric layer 111*a* may have an optical thickness of λ/4. Specifically, because the refractive index n of SiN is 1.86 and the oscillating wavelength λ is 780 nm, the actual film thickness (=λ/4n) may be set to be about 105 nm.

Figure 6:
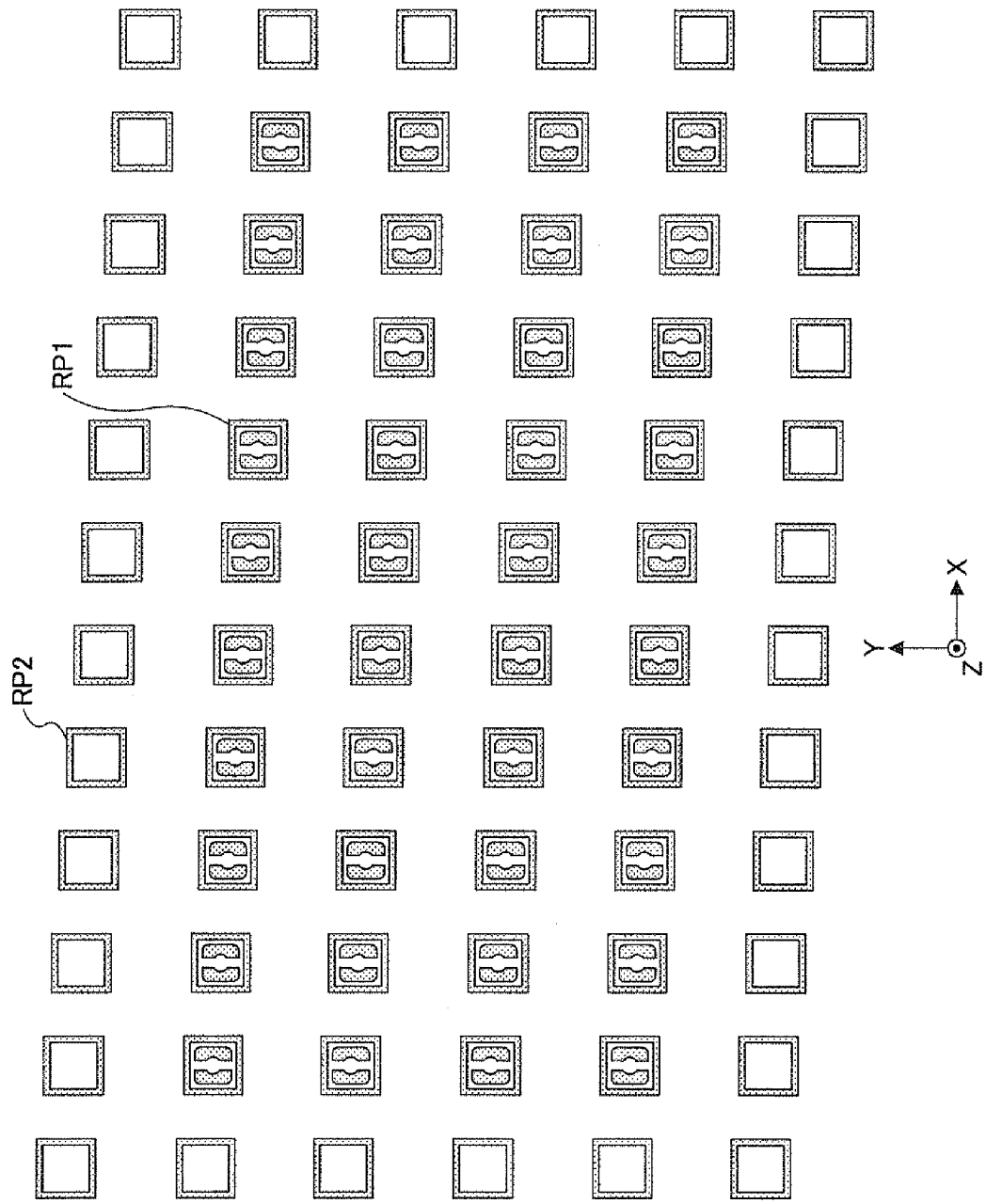
FIG. 6 illustrates a resist pattern for removing unwanted portions of a dielectric layer 111a illustrated in FIG. 5B.

(1-3) A resist pattern for removing unwanted portions in the dielectric layer 111*a* is formed on an upper surface of the dielectric layer 111*a*. For example, as illustrated in FIG. 6, plural resist patterns RP1 are formed in plural areas for light emitting portions, and plural resist patterns RP2 are formed around the plural resist patterns RP1. While the example illustrated in FIG. 6 includes 40 resist patterns RP1 and 32 resist patterns RP2, this is merely an example.

Figure 7A:
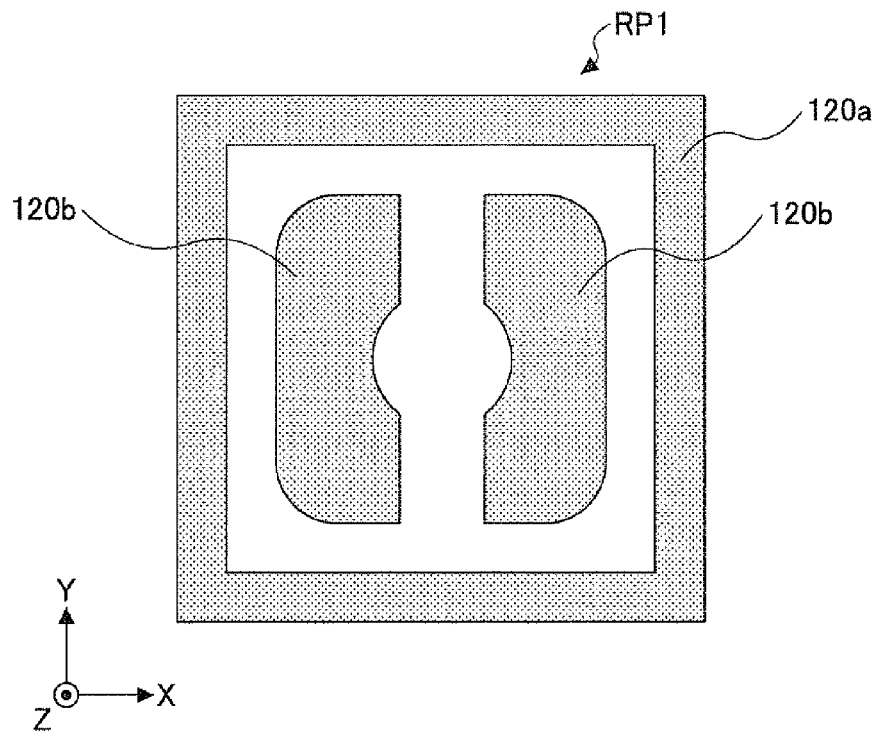
FIG. 7A illustrates a resist pattern RP1.
Figure 7B:
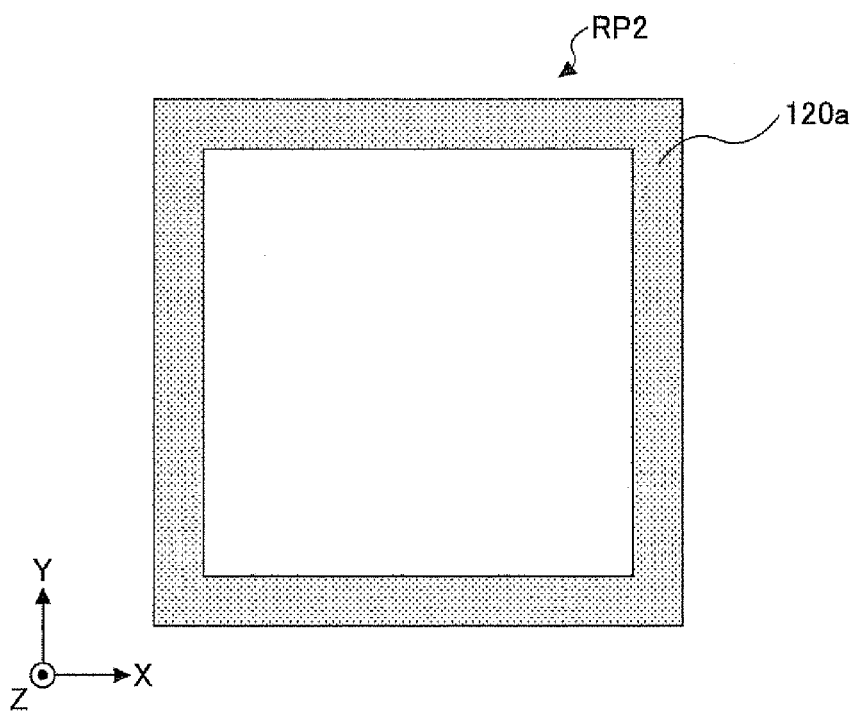
FIG. 7B illustrates a resist pattern RP2.

As illustrated in FIG. 7A, the resist pattern RP1 may include a closed-ring resist pattern 120*a* for defining the outline of a mesa, and two resist patterns 120*b* for masking areas corresponding to small-reflectance portions in an emitting area of the mesa. The resist pattern RP2 may include a closed-ring resist pattern 120*a* for defining the outline of another mesa, as illustrated in FIG. 7B. The resist pattern 120*a* of the resist pattern RP1 and the resist pattern 120*a* of the resist pattern RP2 have the same shape, such as a 25 μm square.

Figure 8:
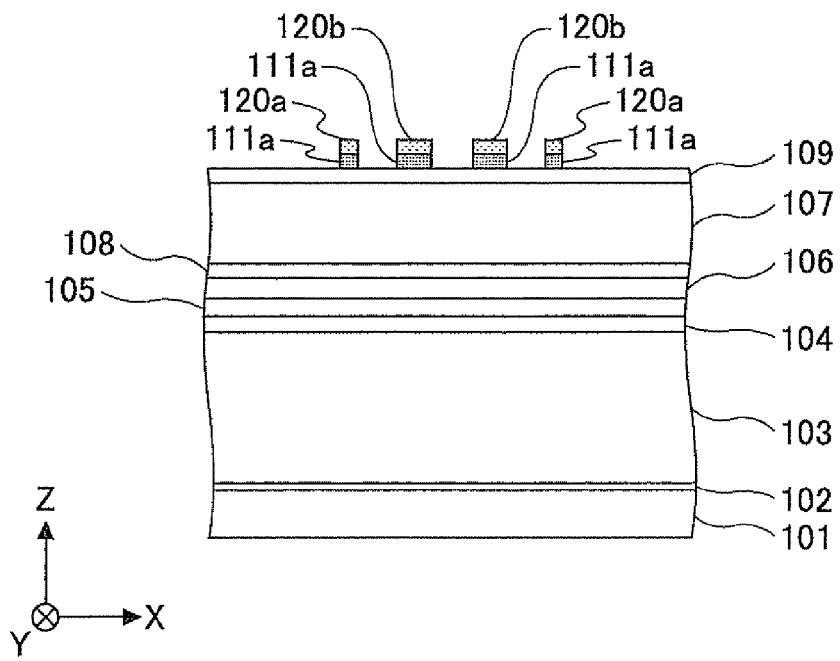
FIG. 8 is a cross section illustrating where the RP1 is formed.
Figure 9:
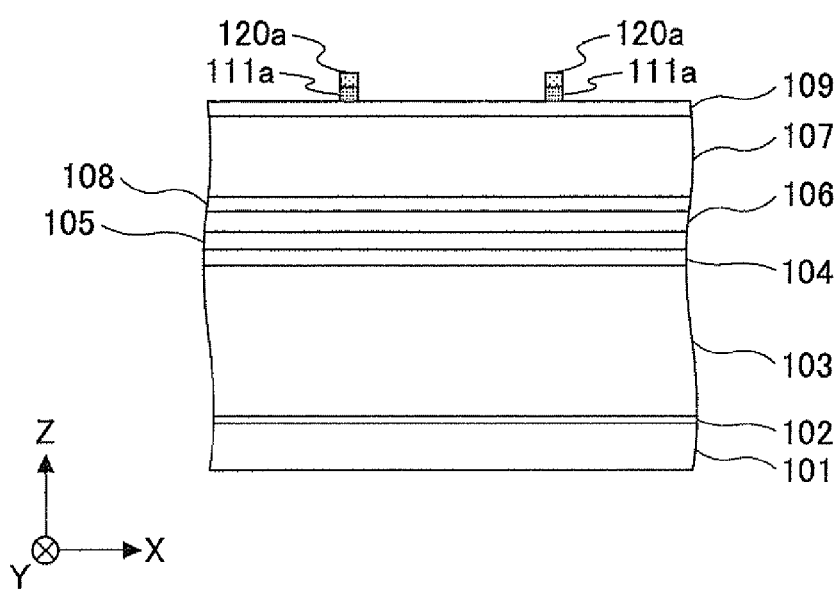
FIG. 9 is a cross section illustrating where the RP2 is formed.

(1-4) The dielectric layer 111a is etched using BHF (buffered hydrofluoric acid). FIG. 8 illustrates where the resist pattern RP1 is formed, while FIG. 9 illustrates where the resist pattern RP2 is formed. In the areas covered with the resist patterns RP1 and RP2, the dielectric layer 111a remains after etching.

Figure 10:
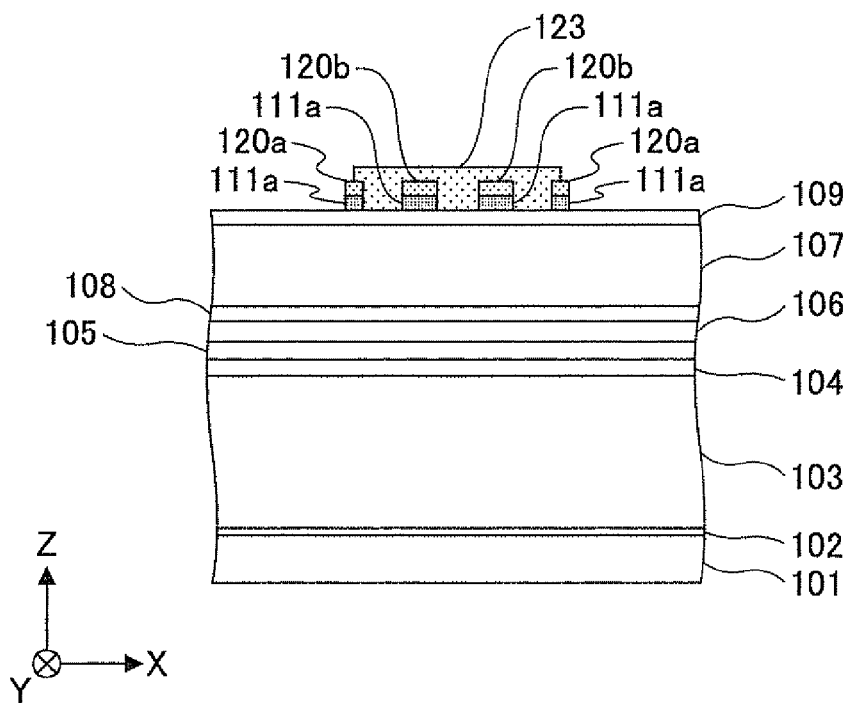
FIG. 10 is a cross section illustrating a resist pattern 123 formed in the areas of the RP1.
Figure 11:
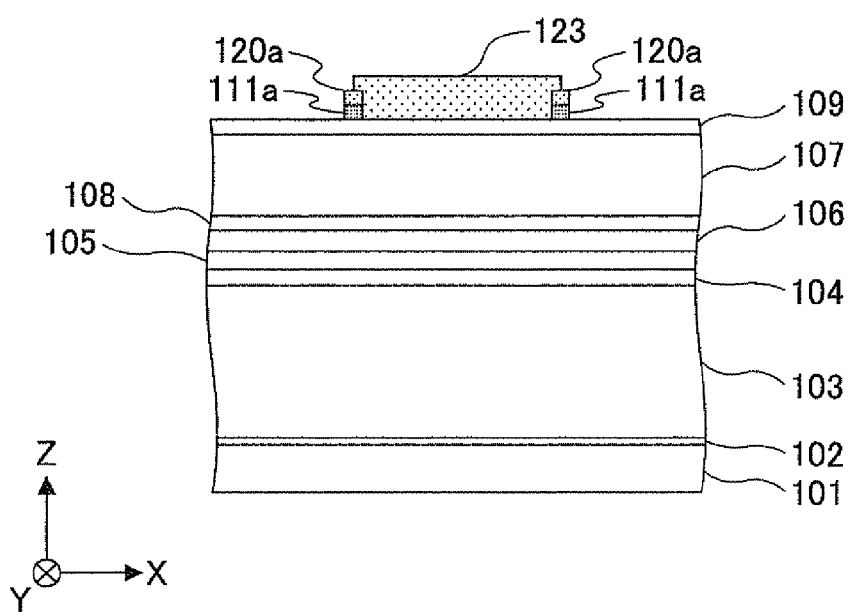
FIG. 11 is a cross section illustrating the resist pattern 123 formed in the areas of the RP2.

(1-5) A resist pattern 123 for protecting areas surrounded by the resist pattern 120a is formed. FIG. 10 illustrates the resist pattern 123 where the resist pattern RP1 is formed. FIG. 11 illustrates the resist pattern 123 where the resist pattern RP2 is formed.

(1-6) A quadrangular prism-shaped mesa structure (which may hereafter referred to simply as "mesa") is formed by an electron cyclotron resonance (ECR) etching process using a Cl2 gas, using the resist pattern 120a and the resist pattern 123 as photomasks. An etched bottom may be located within the lower spacer layer 104.

Figure 12A:
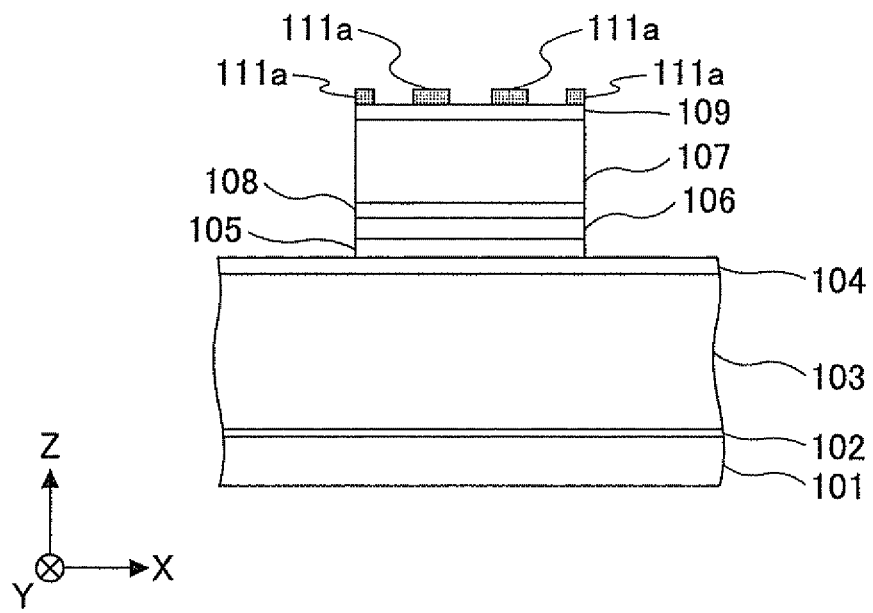
FIG. 12A is a cross section illustrating where the RP1 has been formed.
Figure 12B:
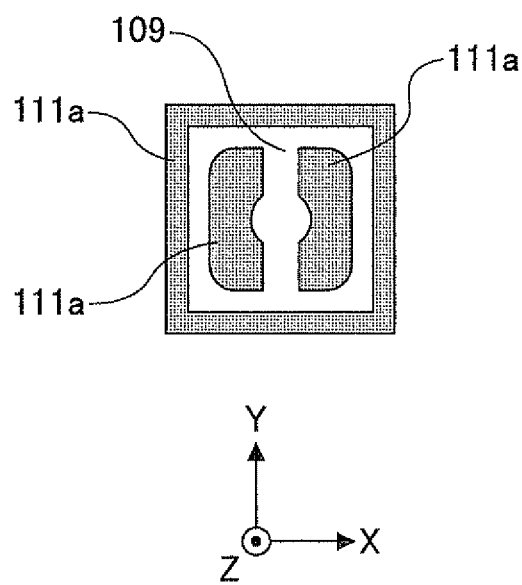
FIG. 12B is a top plan view of FIG. 12A, illustrating areas where the resist pattern RP1 has been formed.
Figure 13A:
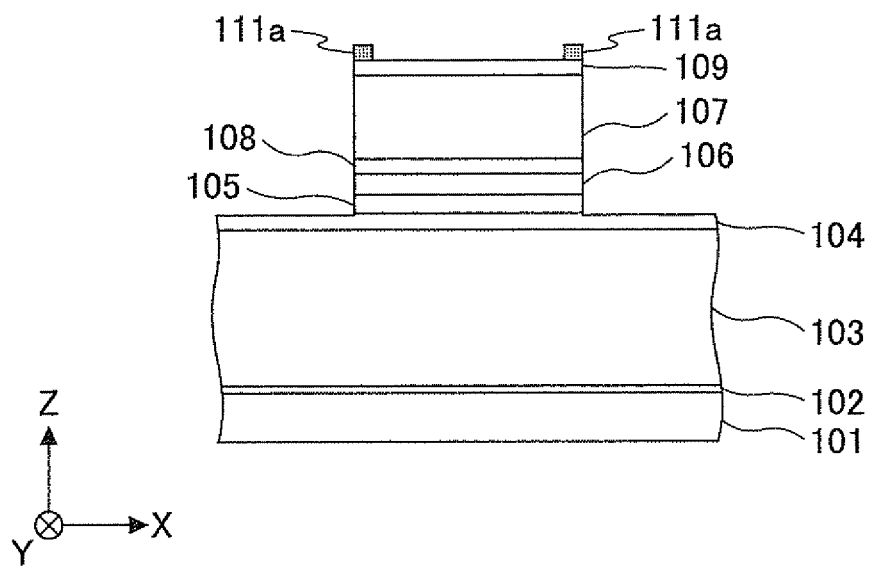
FIG. 13A is a cross section illustrating where the RP2 has been formed.
Figure 13B:
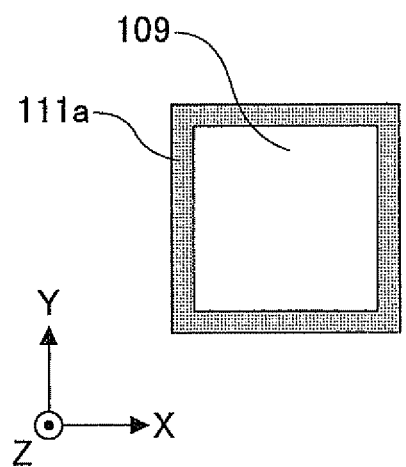
FIG. 13B is a top plan view of FIG. 13A illustrating the areas where the resist pattern RP2 has been formed.

(1-7) The resist patterns are removed. FIGS. 12A and 12B illustrate where the resist pattern RP1 has been formed. FIGS. 13A and 13B illustrate where the resist pattern RP2 has been formed.

(1-8) The layered body is heat-treated in water vapor. Thereby, Al (aluminum) in the to-be-selectively oxidized layer 108 is selectively oxidized from the outer peripheral portions of the mesa, leaving a non-oxidized area 108b at a central portion of the mesa that is surrounded by Al oxide 108a. Thus, a so-called oxidized confinement structure is formed by which the passage of a drive current for the light emitting portion is limited to the central portion of the mesa. Thus, the non-oxidized area 108b is a current passage area (current injection area) which may be substantially square in shape and have a width of 4 μm to 6 μm.

Figure 14A:
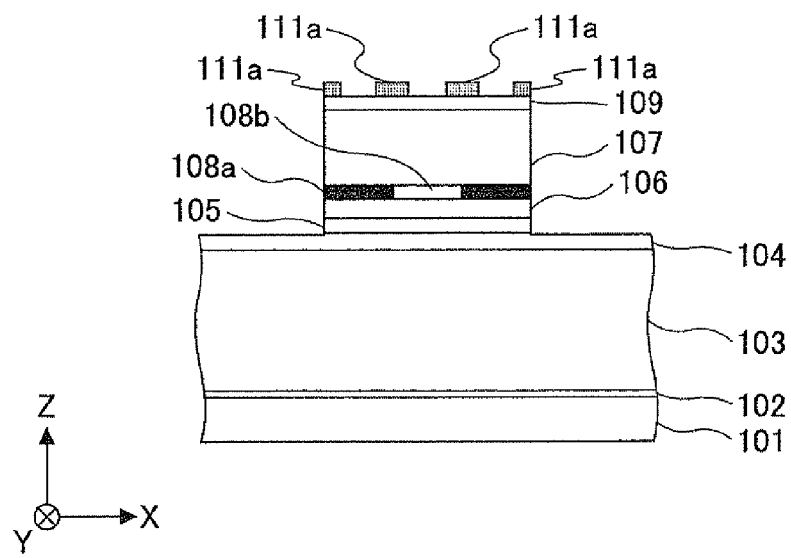
FIG. 14A is a cross section illustrating a non-oxidized area 108b at the center of the mesa corresponding to the RP1.
Figure 14B:
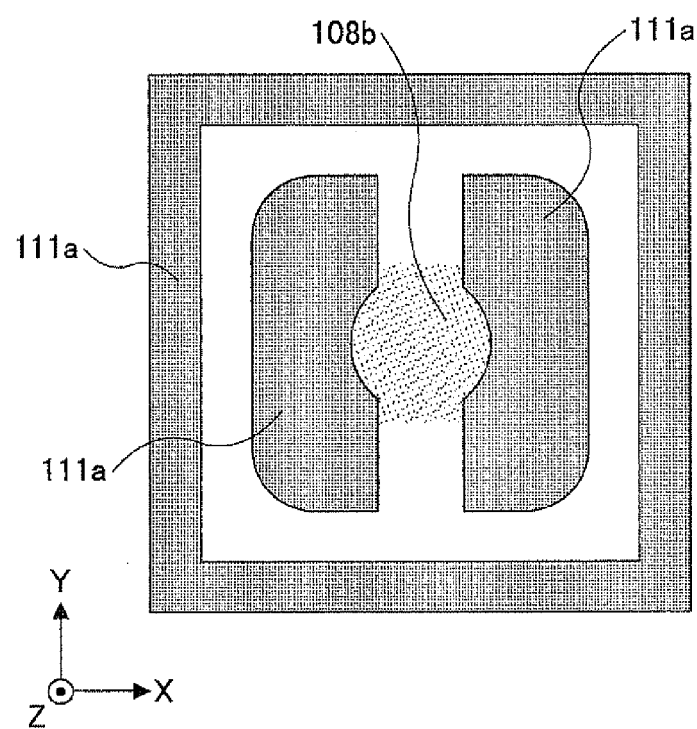
FIG. 14B is a top plan view of FIG. 14A illustrating the central area 108b of the mesa corresponding to the RP1.

FIGS. 14A and 14B illustrate the mesa where the resist pattern RP1 has been formed. FIG. 14B is a plan view of FIG. 14A.

Figure 15A:
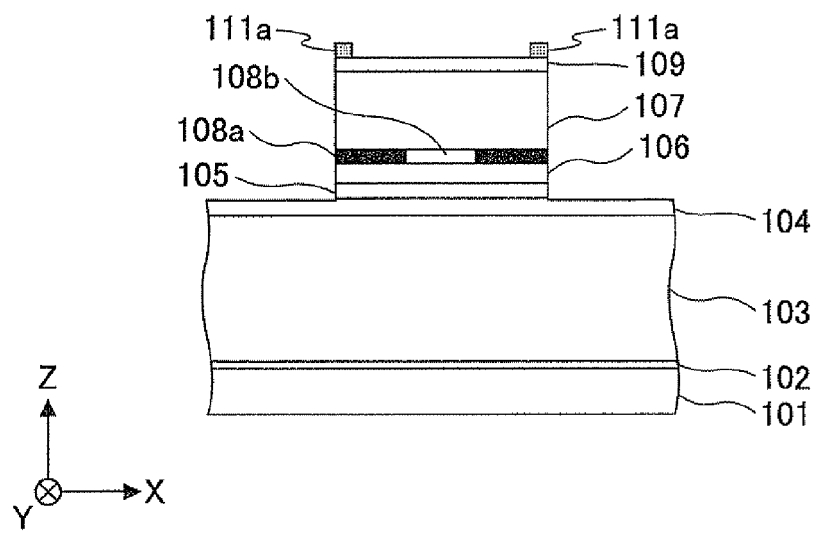
FIG. 15A is a cross section illustrating a non-oxidized area 108b at the center of the mesa corresponding to the RP2.
Figure 15B:
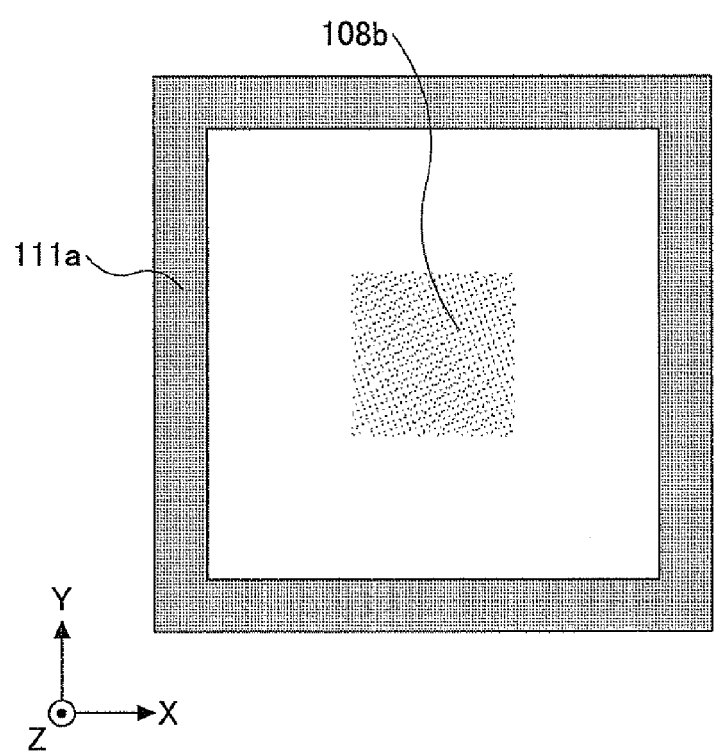
FIG. 15B is a top plan view of FIG. 15A illustrating the central area 108b of the mesa corresponding to the RP2.

FIGS. 15A and 15B illustrate the mesa where the resist pattern RP2 has been formed. FIG. 15B is a plan view of FIG. 15A.

(1-9) The portion where the resist pattern RP2 has been formed is observed by IR microscopy in order to measure the size of the current passage area 108b.

When the portions where the resist pattern RP1 has been formed are observed from the Z-axis direction, as illustrated in FIG. 14B, the dielectric layer 111a is laid over the current passage area 108b. Thus, the size of the current passage area 108b cannot be accurately observed. On the other hand, when the portions where the resist pattern RP2 has been formed are observed from the Z-axis direction, as illustrated in FIG. 15B, the size of the current passage area 108b can be accurately observed.

Thus, the portions where the resist pattern RP2 has been formed may be observed using an IR microscope in order to measure the size of the current passage area 108b. Namely, the portions where the resist pattern RP2 has been formed are used for monitoring the size of the current passage area 108b. Thus, at this stage, the quality of the layered body can be determined. In the following, the mesa at the portion where the resist pattern RP1 has been formed may be referred to as a "light-emitting mesa". The mesa at the portion where the resist pattern RP2 has been formed may be referred to as a "monitoring mesa".

Figure 16:
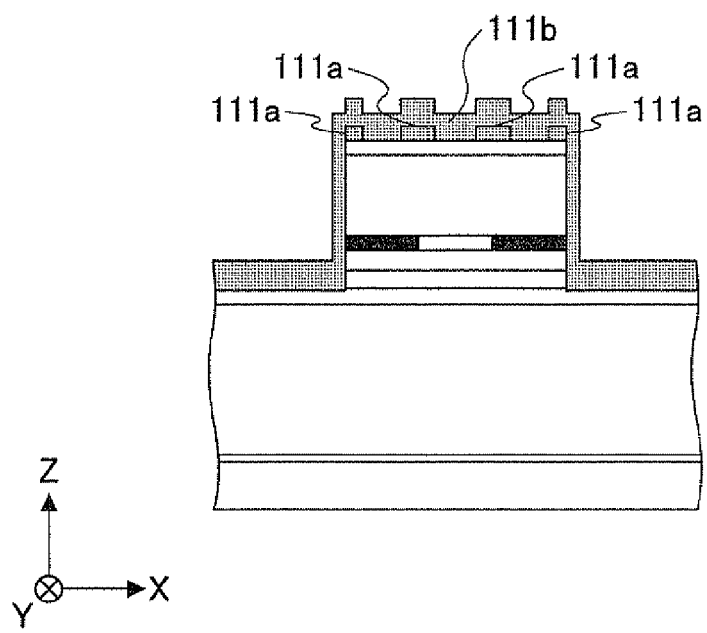
FIG. 16 is a cross section of a light-emitting mesa.
Figure 17:
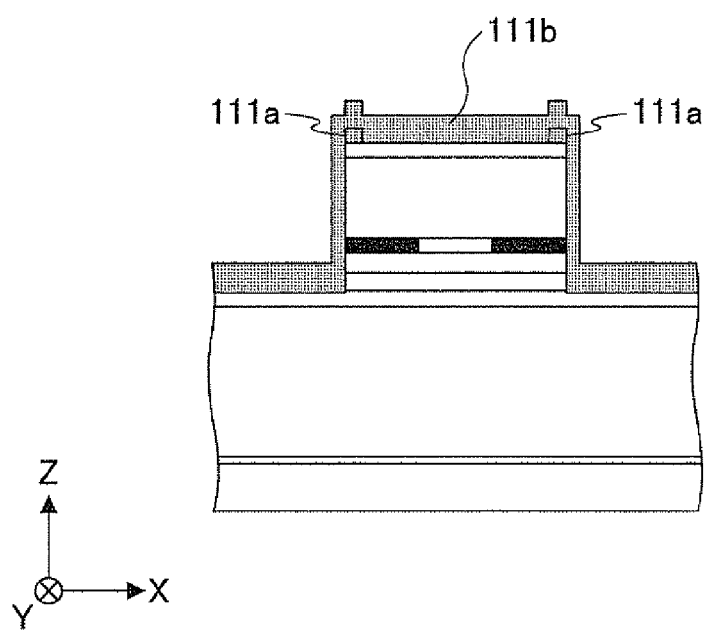
FIG. 17 is a cross section of a monitoring mesa.

(1-10) Using CVD (chemical vapor deposition), a dielectric layer 111b of SiN is formed. The dielectric layer 111b may have an optical thickness of 2λ/4. Specifically, because the refractive index n of SiN is 1.86 and the oscillating wavelength λ is 780 nm, the actual film thickness (=λ/4n) may be set to be about 210 nm. FIG. 16 illustrates the light-emitting mesa, and FIG. 17 illustrates the monitoring mesa.

(1-11) An etching mask for providing a window for a p-side electrode contact is formed on an upper surface of the light-emitting mesa where a laser light emitting surface is to be formed.

(1-12) The dielectric layer 111b is etched by BHF in order to provide the window for the p-side electrode contact of the light-emitting mesa.

Figure 18:
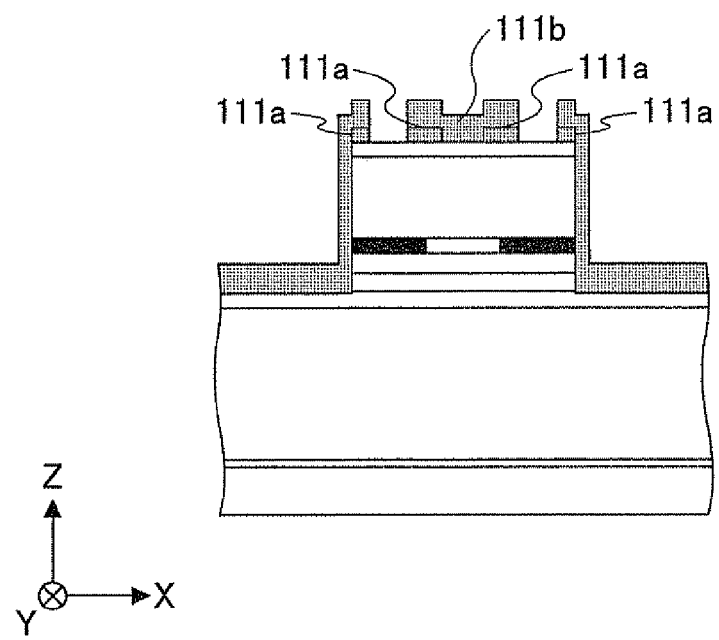
FIG. 18 is a cross section illustrating the light-emitting mesa after etching of a dielectric layer 111b.

(1-13) The etching mask is removed (see FIG. 18).

(1-14) A resist pattern of a 10 μm square is formed in an area on an upper surface of the light-emitting mesa where the light emitting portion is to be formed. Then, a p-side electrode material is vapor-deposited. The p-side electrode material may include a Cr/AuZn/Au multilayer film or a Ti/Pt/Au multilayer film.

Figure 19:
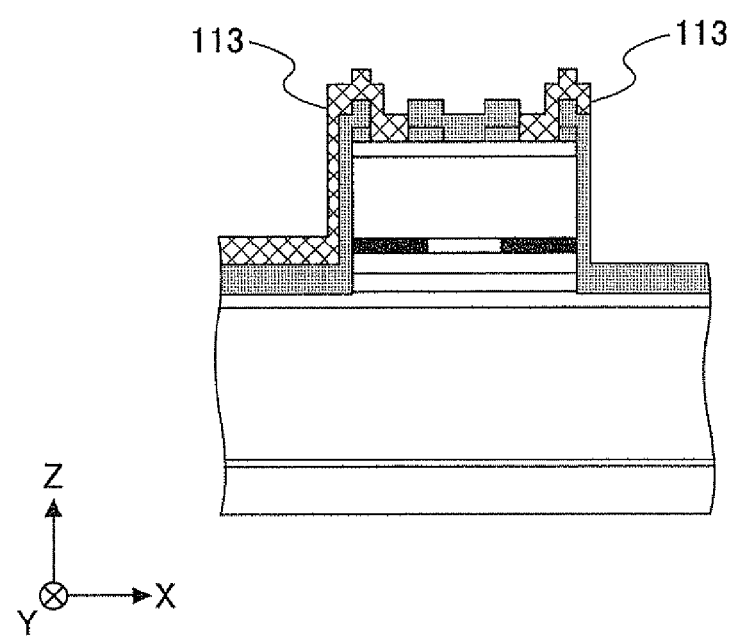
FIG. 19 is a cross section of the light-emitting mesa after a p-side electrode 113 is formed.

(1-15) The electrode material deposited in the light emitting portion is lifted off, and then a p-side electrode 113 is formed (see FIG. 19). The area on top of the light-emitting mesa that is surrounded by the p-side electrode 113 is the emitting area.

Figure 20:
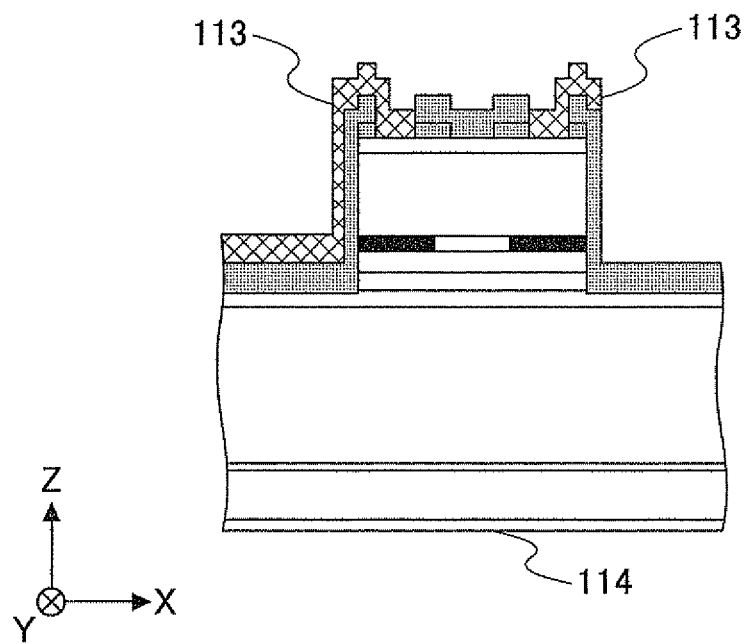
FIG. 20 is a cross section of the light-emitting mesa after an n-side electrode 114 is formed.

(1-16) A back side of the substrate 101 is polished to a predetermined thickness (such as 100 μm), and then an n-side electrode 114 is formed (see FIG. 20). The n-side electrode 114 may include an AuGe/Ni/Au multilayer film.

(1-17) Ohmic contact is provided between the p-side electrode 113 and the n-side electrode 114 by annealing.

(1-18) The substrate is cut into individual chips. The chips may or may not include the monitoring mesa.

Figure 21:
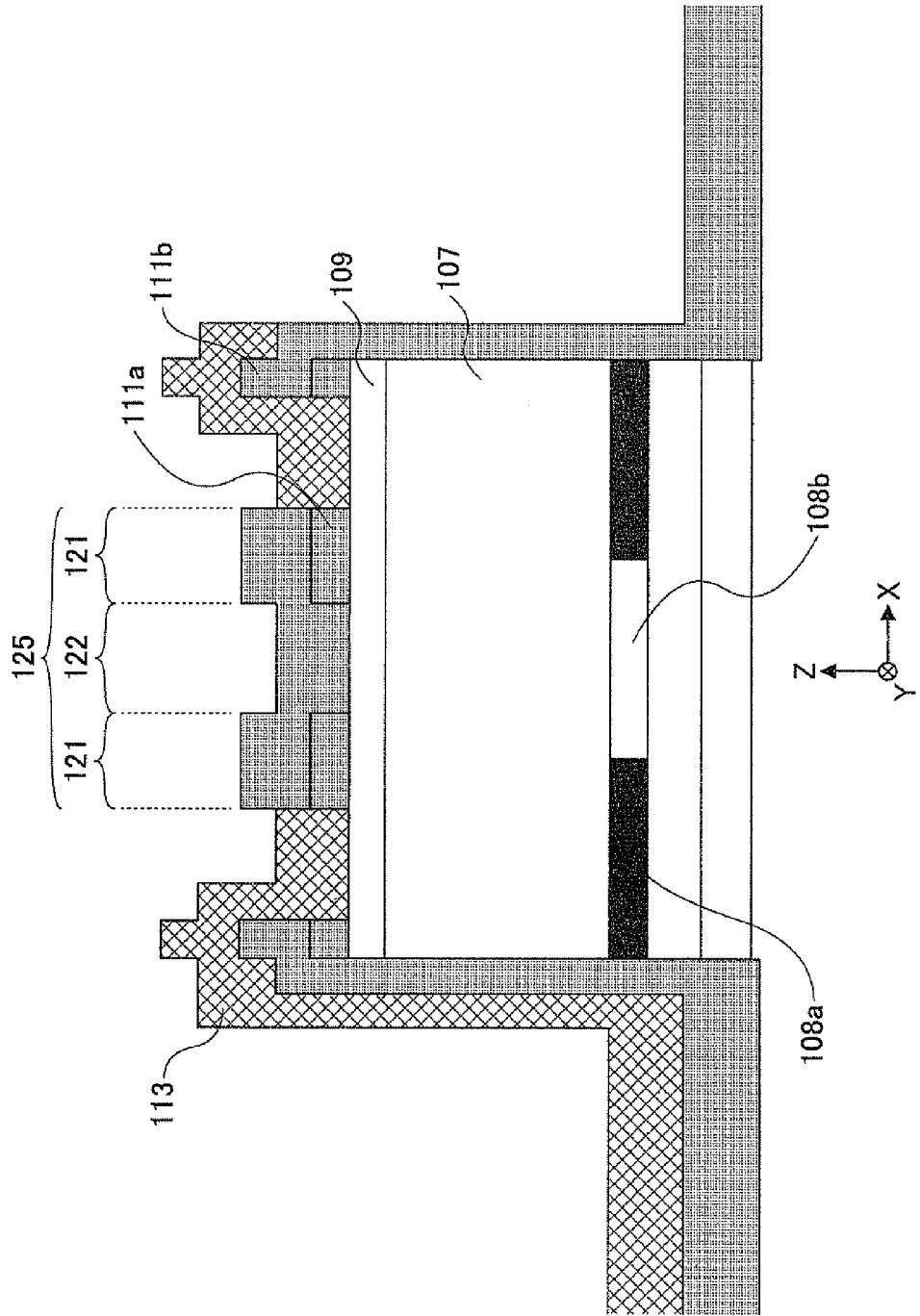
FIG. 21 is an enlarged cross-sectional view of the mesa portion of FIG. 20.

FIGS. 21 and 22 are enlarged views of a light-emitting mesa having an emitting area 125, whose shape may be a 10 μm square. In the present embodiment, the emitting area 125 is covered with a SiN transparent dielectric layer. The SiN transparent dielectric layer may include a high-reflectance portion 122 having an optical thickness of 2λ/4, and two low-reflectance portions 121 having an optical thickness of 3λ/4.

Thus, the surface-emitting laser element 100 according to the present embodiment (see FIG. 3) includes the substrate 101 on which the lower semiconductor DBR 103, the cavity structure including the active layer 105, and the upper semiconductor DBR 107 including the to-be-selectively oxidized layer 108 are layered.

The emitting area 125 of the light emitting portion (see FIG. 21) is entirely covered with an optically transparent dielectric material of SiN, and includes the high-reflectance portion 122 and the two low-reflectance portions 121.

Thus, when the surface-emitting laser element 100 is manufactured, monitoring mesas are formed near the light-emitting mesas, and the to-be-selectively oxidized layers 108 of the mesas are simultaneously selectively oxidized. On the upper surface of the light-emitting mesa, when viewed from the Z-axis direction, the dielectric layer partly overlaps the current passage area. However, on the upper surface of the monitoring mesa, no dielectric layer partly overlaps the current passage area when viewed from the Z-axis direction. Thus, after selective oxidation, the size of the current passage area can be accurately determined by observing the monitoring mesa.

When a light-emitting mesa alone is formed according to a conventional method, the current passage area can be only partly observed, thus preventing an accurate measurement of the size of the current passage area. Thus, in accordance with the present embodiment, the quality of the chips can be determined immediately after selective oxidation, thus improving productivity. As the productivity increases, manufacturing cost of the surface-emitting laser elements can be reduced. This is in contrast to a conventional method whereby the characteristics of the chips need to be individually inspected in order to determine their quality.

In the surface-emitting laser element 100, when the light emitting portion is viewed perpendicularly to the substrate surface by removing the p-side electrode 113, the edge portions of the upper surface of the mesa is covered with the optically transparent dielectric material of SiN, wherein the thickness of the dielectric material is the same as the thickness of the dielectric material of the low-reflectance portion 121.

In the emitting area, the reflectance of the peripheral portions is lower than the reflectance of the central portion, so that oscillation of high-order lateral mode can be prevented without lowering the optical output of fundamental transverse mode. Thus, transverse mode oscillation can be controlled.

Further, anisotropy is introduced into the shape of the area with the relatively high reflectance at the center of the emitting area with respect to two directions that are perpendicular to each other. Thus, anisotropy is intentionally introduced into the laser light confining function of the element with respect to the lateral direction, thus improving stability in polarization direction.

Further, high-order lateral mode can be prevented and polarization direction can be stabilized without reducing the area of the current passage area 108b. Thus, the electric resistance of the surface-emitting laser element can be prevented from increasing, and the current density in the current confinement area can be prevented from increasing, so that the life of the element is not shortened.

Because the emitting area is entirely covered with a dielectric material, oxidation or contamination of the emitting area can be prevented. Further, because the sides of the mesa are covered with the dielectric layer 111b, destruction of the element due to absorption of water, for example, can be prevented, thus enhancing the long-term reliability of the element.

In the optical scanning apparatus 1010 of the present embodiment, the light source 14 includes the surface-emitting laser element 100. In this case, laser light of a single fundamental transverse mode can be obtained, so that a circular and fine laser spot can be readily formed on the surface of the photosensitive drum 1030. Further, because polarization direction is stabilized, the optical scanning apparatus 1010 is not easily affected by a distortion in the light spot or variation in the amount of light. Thus, a circular and fine beam spot with a high optical density can be focused on the photosensitive drum 1030 using a simple optical system. As a result, a highly accurate optical scanning operation can be performed without increasing cost.

Thus, using the laser printer 1000 according to the present embodiment having the optical scanning apparatus 1010, a high-quality image can be formed without an increase in cost.

Figure 23:
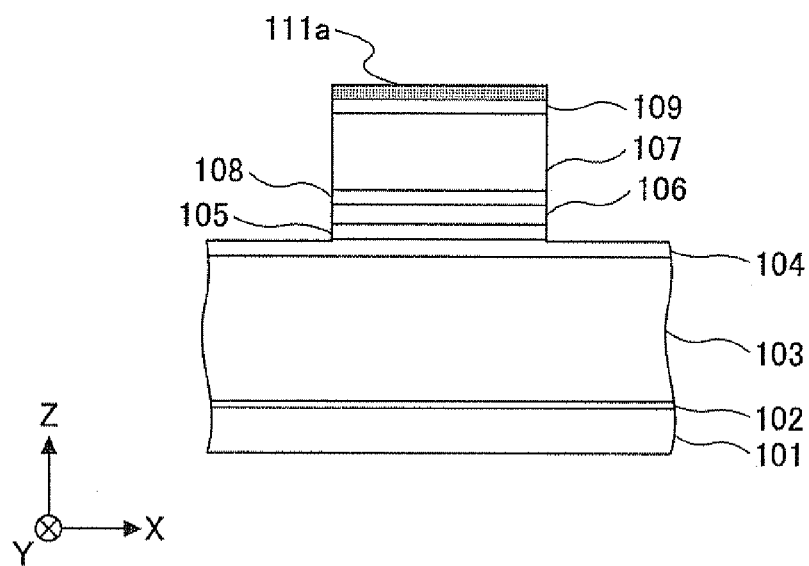
FIG. 23 is a cross section of a variation of a monitoring mesa.
Figure 24:
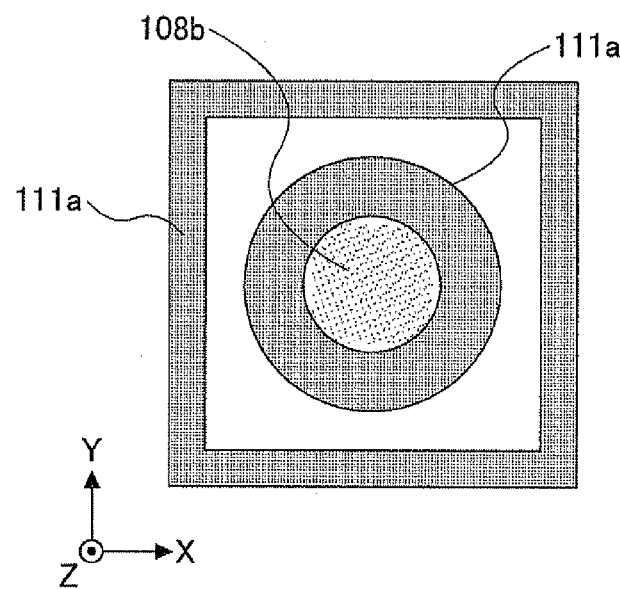
FIG. 24 illustrates a shape of a light-emitting portion of a light-emitting mesa.

Preferably, in the foregoing embodiment, when the layered body is heat-treated in water vapor, the dielectric layer 111a with a uniform thickness may be present on the upper surface of the monitoring mesa, as illustrated in FIG. 23 for example. In this case, too, the size of the current passage area 108b can be accurately observed. The shape of the low-reflectance portion 121 in the emitting area of the light emitting portion is not limited to the shape according to the foregoing embodiment. Preferably, the shape may be circular, as illustrated in FIG. 24.

Further, while the foregoing embodiment has been described as including the two separate low-reflectance portions 121, there may be a single low-reflectance portion. Preferably, the reflectance at the center of the emitting area may be decreased while the reflectance in the peripheral portions may be increased, so that a higher order mode can be selectively operated.

While in the foregoing embodiment, the size of the current passage area 108b is measured immediately after selective oxidation, this is merely an example. The size of the current passage area 108b may be measured any time after selective oxidation, such as after the dielectric layer 111b is formed.

In the foregoing embodiment, if the measured size of the current passage area 108b is not within a permissible range, the subsequent steps may not be performed. While in the foregoing embodiment, the dielectric layer comprises SiN, this is merely an example. Preferably, the dielectric layer may comprise SiNx, SiOx, TiOx, or SiON. In these cases too, similar advantageous effects can be obtained by designing the film thickness in accordance with the refractive index of the particular material.

While in the foregoing embodiment the optical thickness of the dielectric layer 111a is $\lambda/4$, this is merely an example. Namely, it is only required that the optical thickness of the dielectric layer 111a be an odd multiple of $\lambda/4$. While in the foregoing embodiment the optical thickness of the dielectric layer 111b has been described as being $2\lambda/4$, this is merely an example. What is required is that the optical thickness be an even multiple of $\lambda/4$.

Figure 25:
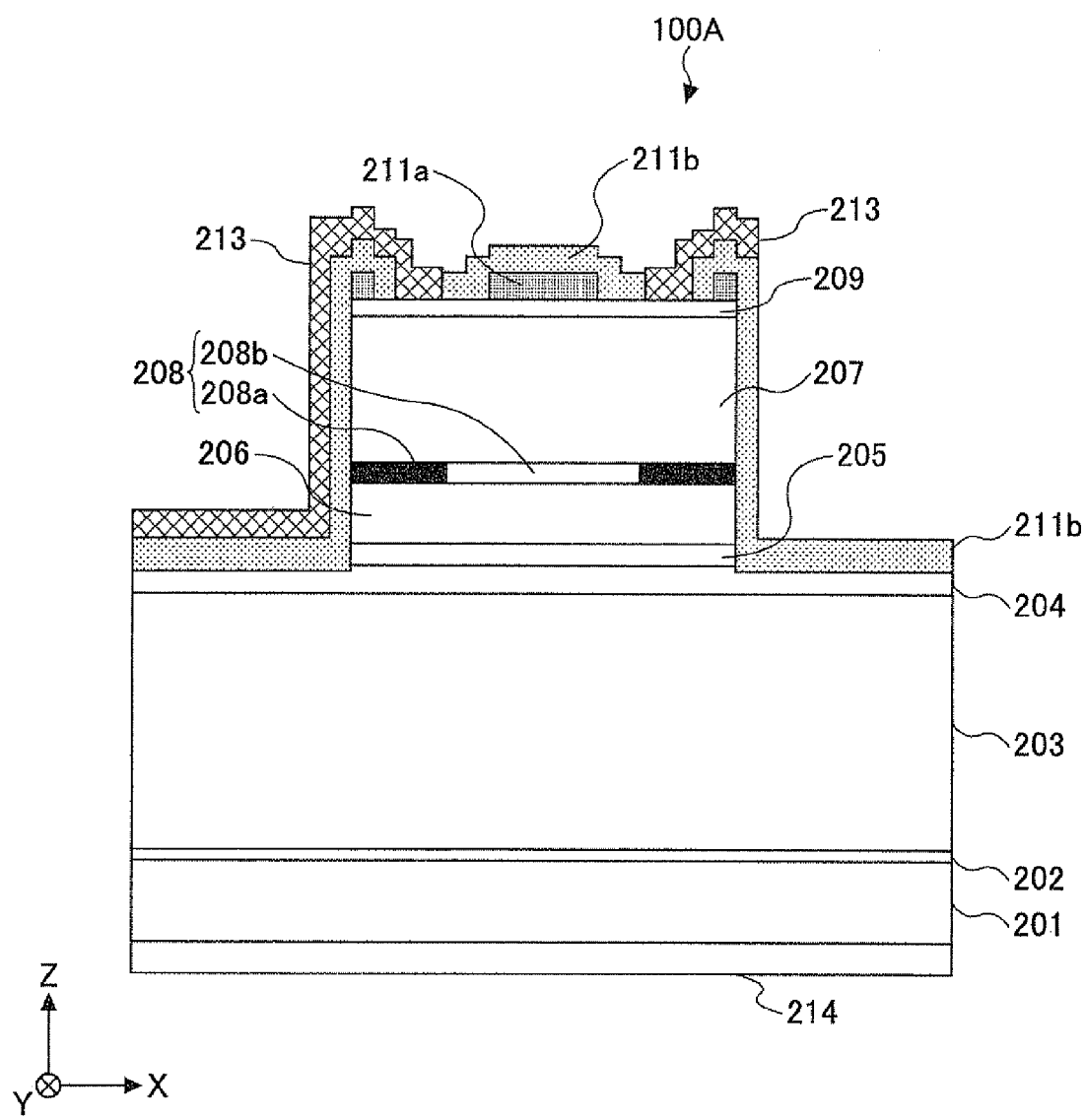
FIG. 25 is a cross section illustrating a surface-emitting laser element according to an embodiment of the present invention.

Preferably, the light source 14 may include a surface-emitting laser element 100A illustrated in FIG. 25 instead of the surface-emitting laser element 100. The surface-emitting laser element 100A may include a surface-emitting laser having an oscillating wavelength in a 780 nm band; a substrate 201; a buffer layer 202; a lower semiconductor DBR 203; a lower spacer layer 204; an active layer 205; an upper spacer layer 206; an upper semiconductor DBR 207; and a contact layer 209.

The substrate 201 comprises a n-GaAs single crystal substrate having a mirror-polished surface. A normal to the mirror-polished surface (principal surface) is inclined from the crystal orientation [1 0 0] towards the crystal orientation [1 1 1] A by an angle $\theta=15°$.

The buffer layer 202 comprises a n-GaAs layer layered on the +Z side of the substrate 201. The lower semiconductor DBR 203 is layered on the +Z side of the buffer layer 202 and includes 40.5 pairs of n-AlAs low-refraction index layers and n-Al0.3Ga0.7As high-refraction index layers. Between the individual refraction index layers, graded composition layers having a thickness of 20 nm are provided in order to reduce electric resistance. The composition of the graded composition layers is varied gradually from one composition to another composition. Each refraction index layer has an optical thickness of $\lambda/4$ including ½ of an adjacent graded composition layer, where $\lambda$ is the oscillating wavelength.

The lower spacer layer 204 is layered on the +Z side of the lower semiconductor DBR 203 and comprises a non-doped (Al0.1Ga0.9)0.5In0.5P layer. The active layer 205 is layered on the +Z side of the lower spacer layer 204. The active layer 205 has a triple quantum well structure including three quantum well layers and four barrier layers. Each of the quantum well layers comprises a GaInAsP composition configured to induce a 0.7% compression strain, and has a bandgap wavelength of about 780 nm. Each of the barrier layers comprises a GaInP composition configured to induce a 0.6% tensile strain.

The upper spacer layer 206 is layered on the +Z side of the active layer 205 and comprises a non-doped (Al0.1Ga0.9)0.5In0.5P layer. The portion formed by the lower spacer layer 204, the active layer 205, and the upper spacer layer 206 may be referred to as a cavity structure, having an optical thickness that corresponds to the oscillating wavelength. The active layer 205 is disposed at the center of the cavity structure corresponding to an anti-node of a standing wave distribution of an electric field so that a high induced emission probability can be obtained.

The upper semiconductor DBR 207 includes the first upper semiconductor DBR and the second upper semiconductor DBR. The first upper semiconductor DBR is layered on the +Z side of the upper spacer layer 106, and includes a pair of a p-(Al0.7Ga3.0)0.5In0.5P low-refraction index layer and a p-(Al0.1Ga0.9)0.5In0.5P high-refraction index layer. The second upper semiconductor DBR is layered on the +Z side of the first upper semiconductor DBR, and includes 21 pairs of p-Al0.9Ga0.1As low-refraction index layers and p-Al0.3Ga0.7As high-refraction index layers.

Between the individual refraction index layers of the upper semiconductor DBR 207, in order to reduce electric resistance, graded composition layers are provided in which the composition is gradually varied from one composition to another composition. Each of the refraction index layers has an optical thickness of λ/4 including ½ of an adjacent graded composition layer.

The second upper semiconductor DBR includes a to-be-selectively oxidized layer 208 of p-AlAs having a thickness of 37 nm. The to-be-selectively oxidized layer 208 is disposed at a position corresponding to the third node, from the active layer 205, of a standing wave distribution of an electric field.

The contact layer 209 is layered on the +Z side of the upper semiconductor DBR 207 and comprises a p-GaAs layer.

Method of Manufacturing Surface-Emitting Laser Element 100A

Next, a method of manufacturing the surface-emitting laser element 100A is described.

(2-1) The above-described semiconductor layers are layered on the substrate 201 by a crystal growing technique such as MOCVD (Metal Organic Chemical Vapor Deposition) or MBE (molecular beam epitaxy) in order to prepare a layered body.

As a Group III material, trimethylaluminium (TMA), trimethylgallium (TMG), or trimethyl indium (TMI) may be used. As a Group V material, phosphine (PH3) or arsine (AsH3) may be used. As a p-type dopant material, carbon tetrabromide (CBr4) or dimethylzinc (DMZn) may be used. As an n-type dopant material, hydrogen selenide (H2Se) may be used.

(2-2) A $SiO_2$ dielectric layer 211a is formed by chemical vapor deposition (CVD). The dielectric layer 211a may have an optical thickness of λ/4. Specifically, because the refractive index n of $SiO_2$ is 1.45 and the oscillating wavelength λ is 780 nm, an actual film thickness (=λ/4n) may be set to be about 135 nm.

(2-3) A resist pattern for removing unwanted portions of the dielectric layer 211a is formed on an upper surface of the dielectric layer 211a. For example, plural resist patterns RP11 are formed in plural areas that are to be formed into light emitting portions, and plural resist patterns RP22 are formed around the plural resist patterns RP11.

Figure 26A:
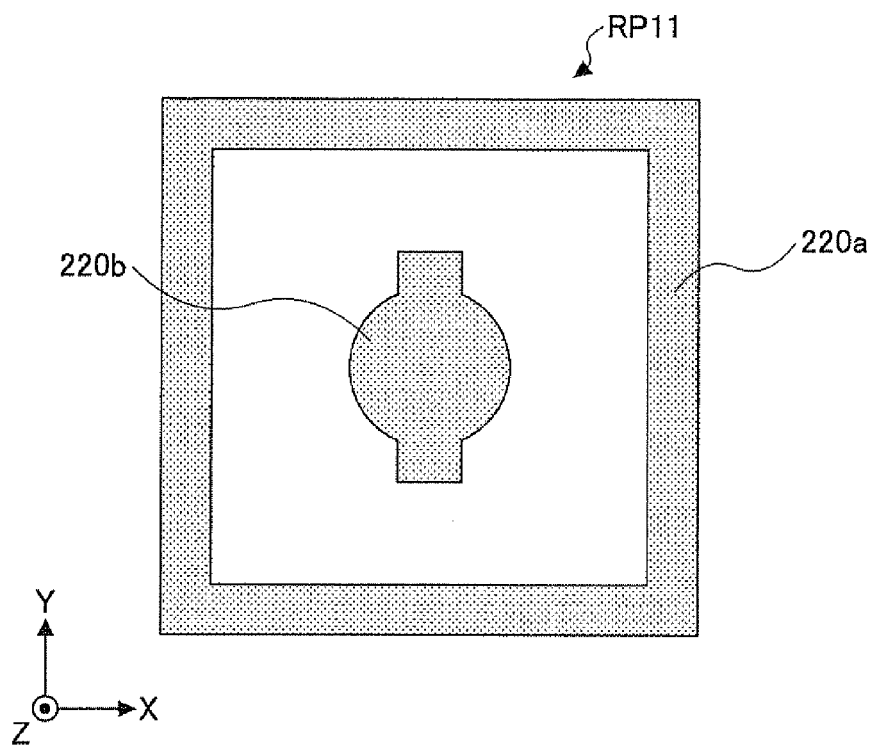
FIG. 26A illustrates a resist pattern RP11 used for manufacturing the surface-emitting laser element illustrated in FIG. 25.
Figure 26B:
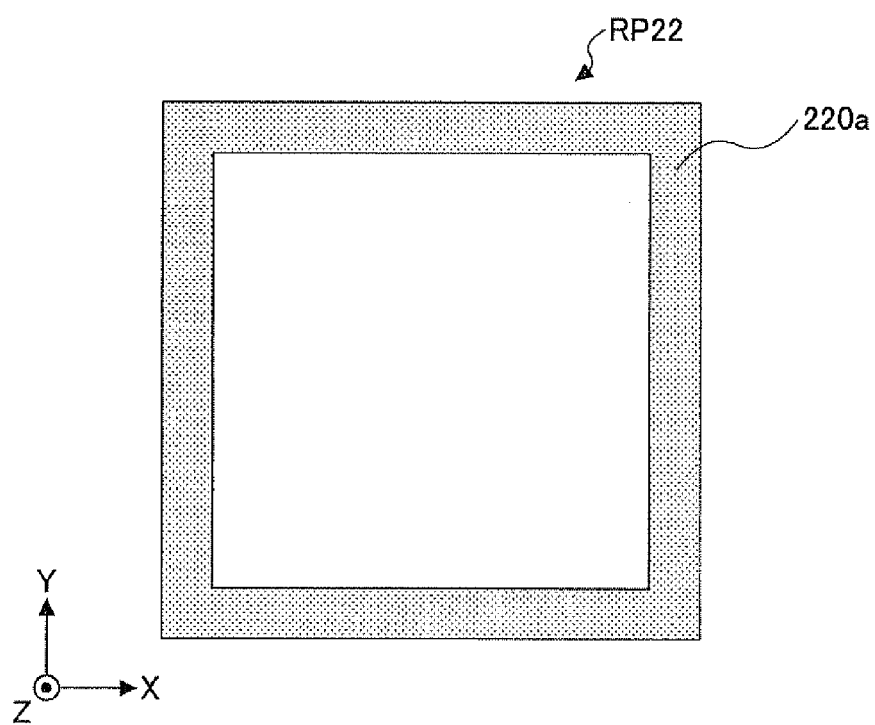
FIG. 26B illustrates a resist pattern RP22 used for manufacturing the surface-emitting laser element illustrated in FIG. 25.

The resist patterns RP11 may include a closed-ring resist pattern 220a for defining the outer shape of a mesa, and a resist pattern 220b for masking an area corresponding to a low-reflectance portion in an emitting area of the mesa, as illustrated in FIG. 26A. The resist patterns RP22 may include a closed-ring resist pattern 220a for defining an outer shape of another mesa, as illustrated in FIG. 26B. The resist pattern 220a of the resist pattern RP11 and the resist pattern 220a of the resist pattern RP22 have the same shape. The outer shape of the resist patterns 220a may be a 25 µm square.

(2-4) The dielectric layer 211a is etched by BHF (buffered hydrofluoric acid). The dielectric layer 211a remains in areas covered with the resist patterns.

(2-5) A resist pattern 223 for protecting the area enclosed by the resist pattern 220a is formed.

(2-6) Using the resist pattern 220a and the resist pattern 223 as photomasks, a quadrangular prism-shaped mesa-structure (mesa) is formed by ECR (Electron Cyclotron Resonance) etching using a Cl2 gas. An etched bottom surface may be positioned within the lower spacer layer 204.

(2-7) The resist patterns are removed.

(2-8) The layered body is heat-treated in water vapor, whereby Al (aluminum) within the to-be-selectively oxidized layer 208 is selectively oxidized from the peripheral portions of the mesa, leaving an area 208b at the center of the mesa that is surrounded by an area of Al oxide 208a. The non-oxidized area 208b forms a current passage area (current injection area), which may have a substantially square shape with a width of 4 µm to 6 µm.

(2-9) The areas where the resist pattern RP22 has been formed are observed by IR microscopy in order to measure the size of the current passage area 208b.

When the area where the resist pattern RP11 has been formed is viewed from the Z-axis direction, the size of the current passage area 208b cannot be accurately determined because the dielectric layer 211a overlaps the current passage area 208b. On the other hand, when the area where the resist pattern RP22 has been formed is viewed from the Z-axis direction, the size of the current passage area 208b can be accurately observed.

Thus, the area where the resist pattern RP22 has been formed may be observed by IR microscopy in order to measure the size of the current passage area 208b. Namely, the area where the resist pattern RP22 has been formed is used as an area for monitoring the size of the current passage area 208b. Thus, the quality of the layered body can be determined at this stage. In the present embodiment, the mesa at the portion where the resist pattern RP11 has been formed may be referred to as a "light-emitting mesa", and the mesa at the portion where the resist pattern RP22 has been formed may be referred to as a "monitoring mesa".

(2-10) A dielectric layer 211b of SiN is formed by chemical vapor deposition (CVD). The dielectric layer 211b may have an optical thickness of λ/4. Specifically, because the refractive index n of SiN is 1.86 and the oscillating wavelength λ is 780 nm, the actual film thickness (=λ/4n) may be set to be about 105 nm.

(2-11) An etching mask for providing a window for a p-side electrode contact is formed on an upper surface of the light-emitting mesa where a laser light emitting surface is to be formed.

(2-12) The dielectric layer 211b is etched by BHF in order to provide the window for the p-side electrode contact of the light-emitting mesa.

(2-13) The etching mask is removed.

(2-14) A resist pattern of a 10 µm square is formed on an upper surface of the light-emitting mesa where a light emitting portion is to be formed, followed by deposition of a p-side electrode material. The p-side electrode material may include a Cr/AuZn/Au multilayer film or a Ti/Pt/Au multilayer film.

(2-15) The electrode material deposited in the area for the light emitting portion is lifted off, and then a p-side electrode 213 is formed.

(2-16) The back side of the substrate 201 is polished to a predetermined thickness (such as 100 µm), and then an n-side electrode 214 is formed. The n-side electrode 214 may include an AuGe/Ni/Au multilayer film.

(2-17) Ohmic conduction is provided between the p-side electrode 213 and the n-side electrode 214 by annealing.

(2-18) The substrate is cut into individual chips.

FIG. 27 is a cross section of a light-emitting mesa of the surface-emitting laser element 100A. The shape of an emitting area 225 may include a 10 μm square. The emitting area 225 may be covered with a transparent dielectric layer comprising SiN and $SiO_2$. The transparent dielectric layer may include a high-reflectance portion 222 comprising SiN and $SiO_2$ and having an optical thickness of $2\lambda/4$, and a low-reflectance portion 221 comprising only SiN and having an optical thickness of $\lambda/4$.

Thus, during the manufacture of the surface-emitting laser element 100A, a monitoring mesa is formed near the light-emitting mesa. After the to-be-selectively oxidized layers 208 of the mesas are simultaneously selectively oxidized, the monitoring mesas are observed. Thus, the size of the current passage area can be accurately measured.

In the emitting area of the surface-emitting laser element 100A, the reflectance of the peripheral portion is lower than the reflectance of the central portion. Thus, oscillation of high-order lateral mode can be prevented without lowering the optical output of fundamental transverse mode. Namely, transverse mode oscillation can be controlled.

Further, in the surface-emitting laser element 100A, because the high-reflectance area is formed by a pair (SiN/$SiO_2$) of DBR layers, the high-reflectance area has a very high reflectance, so that a large reflectance difference can be obtained between the central portion and the peripheral portion. Thus, an enhanced transverse mode oscillation control effect can be obtained.

In the surface-emitting laser element 100A, anisotropy is introduced into the shape of the high-reflectance area at the central portion of the emitting area with respect to two directions perpendicular to each other. In this way, anisotropy is intentionally introduced into the laser light confining function of the surface-emitting laser element 100A in the lateral direction. Thus, improved stability in polarization direction can be achieved.

Further, in the surface-emitting laser element 100A, high-order lateral mode can be controlled and polarization direction can be stabilized without decreasing the area of the current passage area 208b. Thus, the electric resistance of the current confinement area can be prevented from increasing, and also the density of the current confinement area can be prevented from increasing, thus preventing a decrease in element life.

In the surface-emitting laser element 100A, because the emitting area is entirely covered with a dielectric material, oxidation or contamination of the emitting area can be prevented. Further, because the sides of the mesa are covered with the dielectric layer 211b, destruction of the element due to absorption of water, for example, can be prevented, thus increasing the long-term reliability of the element.

Figure 28A:
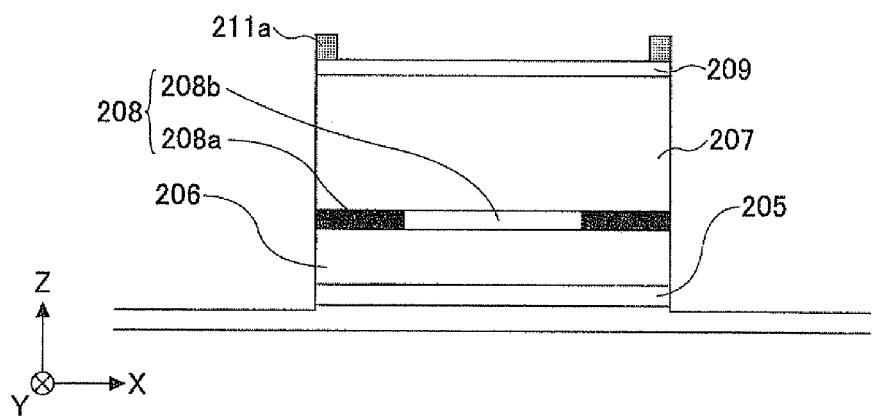
FIG. 28A is a partial cross section of a monitoring mesa after step (2-8)
Figure 28B:
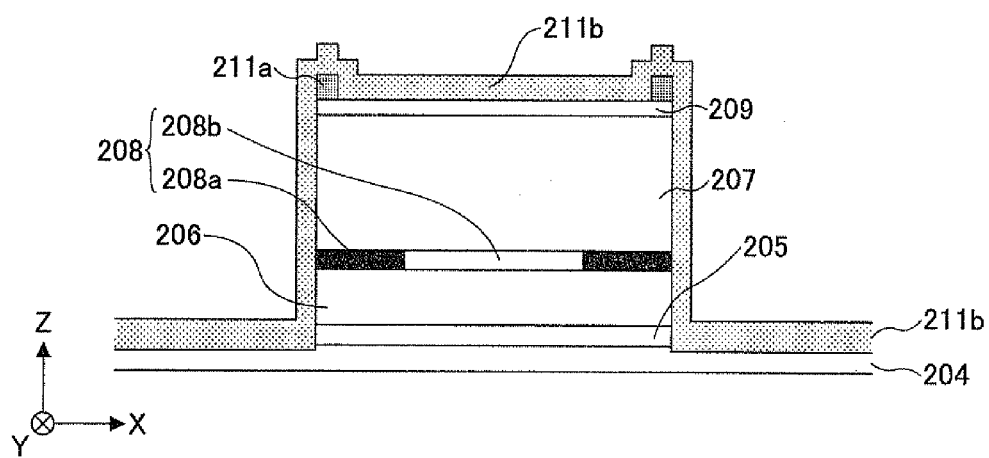
FIG. 28B is a partial cross section of a monitoring mesa after step (2-10)

While in the present embodiment the size of the current passage area 208b is measured after step (2-8), such measurement may be performed after the SiN film is formed in step (2-10). FIG. 28A is a cross section of a monitoring mesa after step (2-8). FIG. 28B is a cross section of the monitoring mesa after step (2-10).

Figure 29:
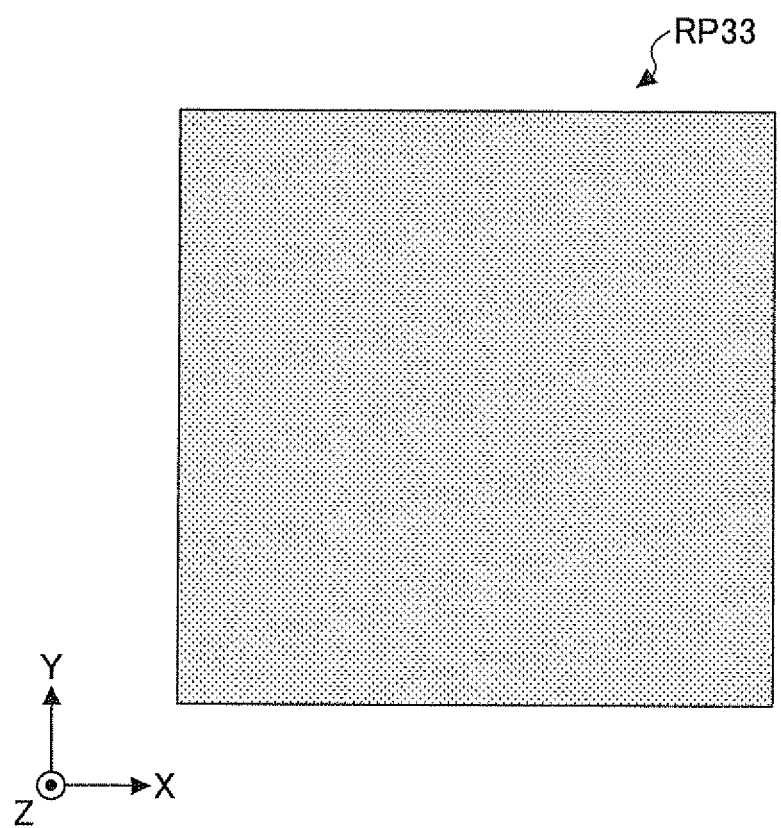
FIG. 29 illustrates a resist pattern RP33 which is a variation of the resist pattern RP22.
Figure 30A:
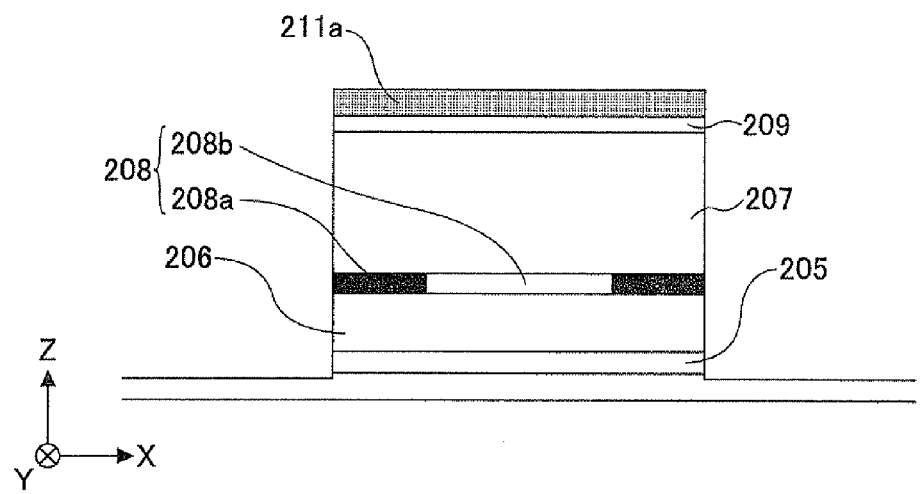
FIG. 30A is a partial cross section of a monitoring mesa after step (2-8) when the resist pattern RP33 is used.
Figure 30B:
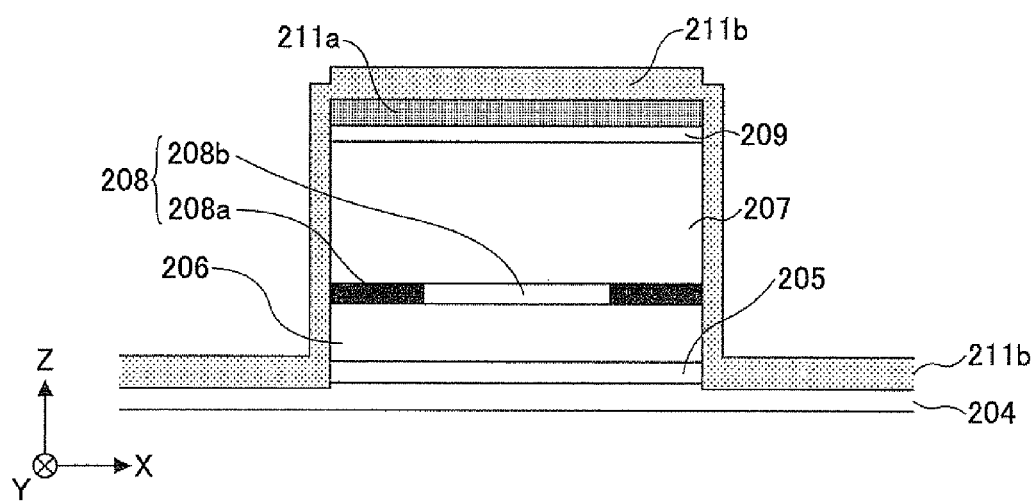
FIG. 30B is a partial cross section of the monitoring mesa after step (2-10) when the resist pattern RP33 is used.

Instead of the resist pattern RP22, a resist pattern RP33 illustrated in FIG. 29 may be used. The resist pattern RP33 has a substantially square shape configured to define the outer shape of a mesa. In this case, a partial cross section of a monitoring mesa after step (2-8) is illustrated in FIG. 30A, while a partial cross section of the monitoring mesa after step (2-10) is illustrated in FIG. 30B.

Surface-Emitting Laser Array

Further, the light source 14 in the foregoing embodiment may include a surface-emitting laser array 200 illustrated in FIG. 31 instead of the surface-emitting laser element 100. The surface-emitting laser array 200 includes a plurality (21 in the illustrated example) of two-dimensionally arranged light emitting portions on the same substrate. The X-axis direction is along the main-scan corresponding direction and the Y-axis direction is along the sub-scan corresponding direction.

The light emitting portions are disposed at regular intervals of d2 in an orthogonal projection on an imaginary line extending along the Y-axis direction. In the present specification, the "intervals" of the light emitting portions refer to the distance between the centers of any two adjacent light emitting portions. The number of the light emitting portions is not limited to 21.

Each of the light emitting portions may have a cross section of FIG. 32, which is taken along line A-A of FIG. 31 and which is similar to the structure of the surface-emitting laser element 100 of the foregoing embodiment. The surface-emitting laser array 200 may be manufactured by the same method as that for the surface-emitting laser element 100. Thus, the surface-emitting laser array 200 can provide similar effects as those of the surface-emitting laser element 100. Further, the surface-emitting laser array 200 can emit plural beams of laser light of single fundamental transverse mode having a uniform polarization direction among the respective light emitting portions. Thus, using the surface-emitting laser array 200, 21 fine circular light spots having a high optical density can be simultaneously formed on the photosensitive drum 1030.

Preferably, monitoring mesas may remain on a chip of the surface-emitting laser array 200 as illustrated in FIG. 33.

In the surface-emitting laser array 200, because the light emitting portions are disposed at the regular intervals of d2 in an orthogonal projection on an imaginary line along the sub-scan corresponding direction, the structure can be considered to be equivalent to 21 light emitting portions arranged on the photosensitive drum 1030 at regular intervals in the sub-scan direction, by adjusting the timing of activation of the 21 light emitting portions.

For example, when the interval d2 is 2.65 pm and the optical system of the optical scanning apparatus 1010 has a magnification of 2, a high-density write operation of 4800 dpi (dots per inch) can be performed. It goes without saying that an even higher density and therefore higher-quality printing can be achieved by increasing the number of the light emitting portions in the main-scan corresponding direction, by narrowing the pitch d1 in the sub-scan corresponding direction, thus reducing the interval d2, and/or by decreasing the magnification of the optical system. Write intervals in the main-scan direction can be easily controlled by the timing of activation of the light emitting portions.

In this case, the laser printer 1000 can perform printing without decrease in print speed even if the write dot density increases. Further, the print speed can be further increased for the same write dot density. In addition, the laser printer 1000 can form a high-quality image stably because the polarization direction of the light beams from the respective light emitting portions is stable and uniform.

Preferably, a groove between any two adjacent light emitting portions may have a distance of at least 5 μm for ensuring sufficient electric and spatial separation between the individual light emitting portions. If the groove is too narrow, it may become difficult to control etching during the manufacturing process. Preferably, the size of a mesa (i.e., the length of each side) is 10 μm or more. If the size is too small, heat may not be able to escape during operation, resulting in a degradation in characteristics.

In the foregoing embodiment, instead of the surface-emitting laser element 100, a surface-emitting laser array may be employed that is manufactured by the same method as for the surface-emitting laser element 100 and in which light emitting portions similar to those of the surface-emitting laser element 100 are one-dimensionally arranged.

While in the foregoing embodiment a normal to the principal surface of the substrate 101 has been described as being inclined from the crystal orientation [1 0 0] towards the crystal orientation [1 1 1] A by 15 degrees, the present invention is not limited to such an example. When an inclined substrate is used, the normal to the principal surface of the substrate may be inclined from a crystal orientation <1 0 0> towards a crystal orientation <1 1 1>. In an embodiment, the substrate 101 may not be inclined.

The oscillating wavelength of the light emitting portions is not limited to the 780 nm band and may be varied depending on the characteristics of the photosensitive material.

The surface-emitting laser element 100 and the surface-emitting laser array 200 may be utilized for purposes other than an image forming apparatus. In such a case, the oscillating wavelength may include a 650 nm band, a 850 nm band, a 980 nm band, 1.3 μm band, or a 1.5 μm band, depending on the particular purpose. In such cases, the semiconductor material of the active layer may include a mixed-crystal semiconductor material suitable for the oscillating wavelength. For example, in the 650 nm band, an AlGaInP mixed-crystal semiconductor material may be used; in the 980 nm band, an InGaAs mixed-crystal semiconductor material may be used; and in the 1.3 μm band and the 1.5 μm band, a GaInNAs(Sb) mixed-crystal semiconductor material may be used.

By selecting the material and the structure of each reflecting mirror depending on the oscillating wavelength, a light emitting portion adapted for a desired oscillating wavelength may be formed. Material other than AlGaAs mixed-crystals, such as a AlGaInP mixed-crystal, may be used. Preferably, a combination of the low-refraction index layer and the high-refraction index layer is selected such that they are transparent to the oscillating wavelength and have as much refractive index difference between them as possible.

While in the foregoing embodiment, the laser printer 1000 has been described as an embodiment of the image forming apparatus of the present invention, such an embodiment is merely an example and does not limit the present invention. In another embodiment of the present invention, an image forming apparatus may be configured to directly irradiate a medium (such as a sheet of paper) configured to develop a color upon laser irradiation, with laser light.

In an image forming apparatus according to an embodiment of the present invention, a silver halide film may be used as an image carrier. In this case, a latent image may be formed on the silver halide film by optical scanning, and then the latent image may be rendered visible by a process equivalent to developing in the conventional silver halide photography process. Thereafter, the visible image may be transferred onto printing paper by a process equivalent to printing in the conventional silver halide photography process. Such an image forming apparatus may be implemented as an optical plate making apparatus or an optical image drawing apparatus for drawing a CT scan image and the like.

Figure 34:
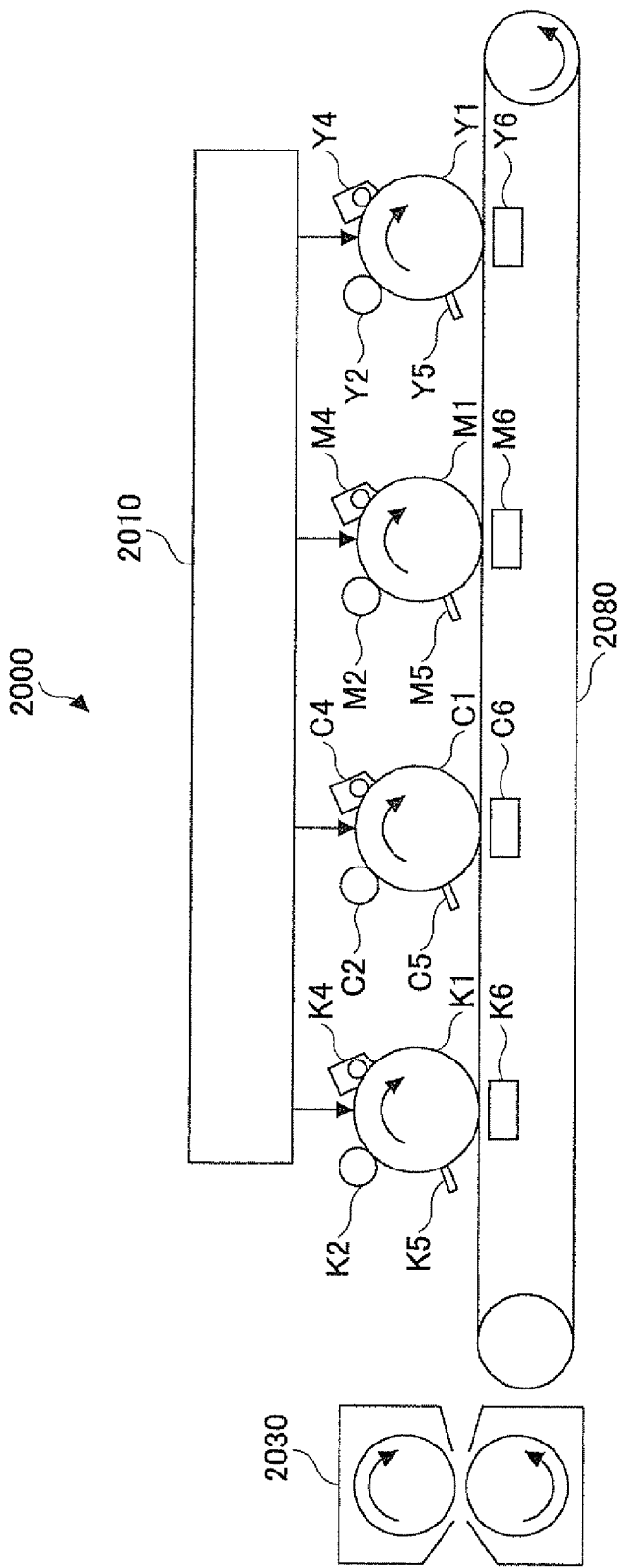
FIG. 34 is a schematic illustration of a color printer.

In an embodiment of the present invention, a color printer 2000 may include a plurality of photosensitive drums, as illustrated in FIG. 34. The color printer 2000 is a tandem multicolor printer configured to form a full-color image by superposing four colors (black, cyan, magenta, and yellow) upon one another. Specifically, the color printer 2000 includes a black station, a cyan station, a magenta station, and a yellow station. The various color stations include photosensitive drums K1, C1, M1, or Y1; charging units K2, C2, M2, or Y2; developing units K4, C4, M4, or Y4; cleaning units K5, C5, M5, or Y5, and transfer units K6, C6, M6, or Y6. The color printer 2000 also includes an optical scanning apparatus 2010, a transfer belt 2080, and a fusing unit 2030.

The photosensitive drums K1, C1, M1, and Y1 are configured to rotate in a direction indicated by an arrow on the drums. The charging units K2, C2, M2, and Y2, the developing units K4, C4, M4, or Y4, the transfer units K6, C6, M6, or Y6, and the cleaning units K5, C5, M5, or Y5 are disposed around the respective photosensitive drums K1, C1, M1, and Y1 along the direction of rotation. The charging units K2, C2, M2, and Y2 are configured to charge the surface of the corresponding photosensitive drums uniformly. The charged surface of each photosensitive drum is irradiated with light emitted from the optical scanning apparatus 2010 in order to form a latent image on the photosensitive drums. The developing units K4, C4, M4, and Y4 are configured to form a color toner image on the surface of each photosensitive drum. The respective color toner images on the photosensitive drums K1, C1, M1, and Y1 are transferred by the corresponding transfer units onto a recording paper on the transfer belt 2080. The transferred image is finally fused onto the recording paper by the fusing unit 2030.

The optical scanning apparatus 2010 includes light sources for the respective colors. The light sources may include surface-emitting laser elements similar to the surface-emitting laser element 100, or a surface-emitting laser array similar to the surface-emitting laser array 200. Thus, the optical scanning apparatus 2010 can provide similar effects to those provided by the optical scanning apparatus 1010. Because the color printer 2000 includes the optical scanning apparatus 2010, the color printer 2000 can provide similar effects to those provided by the laser printer 1000.

In the color printer 2000, a color position error may be caused by manufacturing error or position error of components. Such a color position error can be reduced by selecting the light emitting portions of the surface-emitting laser array that are turned on when the light sources of the optical scanning apparatus 2010 are similar to those of the surface-emitting laser array 200.

Thus, the surface-emitting laser element 100 and the surface-emitting laser array 200 according to the embodiments of the present invention may be suitably used for controlling the transverse mode oscillation without increasing cost. The optical scanning apparatus according to the embodiments of the present invention may be suitably used for a highly accurate optical scanning operation without increasing cost. The image forming apparatuses according to the embodiments of the present invention may be suitably used for forming high-quality images without increasing cost. Further, the methods of manufacturing a surface-emitting laser element according to the various embodiments of the present invention may be suitably used for improving the productivity of a surface-emitting laser element in which transverse mode oscillation is controlled.

Although this invention has been described in detail with reference to certain embodiments, variations and modifications exist within the scope and spirit of the invention as described and defined in the following claims.

The present application is based on the Japanese Priority Applications No. 2009-134907 filed Jun. 4, 2009 and No.

2010-023994 filed Feb. 5, 2010, the entire contents of which are hereby incorporated by reference.

The invention claimed is:

1. A surface-emitting element comprising:
   a substrate;
   a light-emitting mesa structure; and
   a monitoring mesa structure disposed near the light-emitting mesa structure,
   wherein each of the monitoring mesa structure and the light-emitting a structure includes a lower reflecting mirror, a cavity structure including an active layer, and an upper reflecting mirror having a confinement structure in which a current passage area is surrounded by an oxide,
   wherein an emitting area of the light emitting mesa structure includes a high reflectance portion and a low reflectance portion,
   wherein the monitoring-mesa structure is configured to monitor the size of the current passage area after completion of selective oxidation, and
   wherein an upper surface of the light-emitting mesa structure and an upper surface of the monitoring mesa structure are of the same size.

2. The surface-emitting laser element according to claim 1, wherein an upper surface of the emitting area is covered with an optically transparent film,
   the optically transparent film including a first portion having an optical thickness corresponding to an odd multiple of $\lambda/4$, and a second portion having an optical thickness corresponding to an even multiple of $\lambda/4$, where A is an oscillating wavelength.

3. The su cot according to claim 2, wherein the first portion is disposed away from a center of the emitting area.

4. The surface-emitting laser element according to claim 2, wherein the second portion is disposed at a central portion of the emitting area and covered with an optically transparent film having two layers.

5. The surface-emitting laser element according to claim 1, wherein an upper surface of the emitting area is entirely covered with a transparent dielectric material,
   wherein, when the light-emitting mesa structure is viewed from a direction perpendicular to a surface of the substrate, a peripheral edge portion on the upper surface of the light-emitting mesa structure is covered with an optically transparent film,
   wherein the optically transparent film covering the peripheral edge portion has the same thickness as the thickest film of a transparent film of the high-reflectance portion and of a transparent film of the low-reflectance portion.

6. The surface-emitting laser element according to claim 1, wherein an upper surface of the monitoring-mesa structure is layered with an optically transparent film having a uniform thickness except for a peripheral edge portion.

7. The surface-emitting laser element according to claim 6, wherein the optically transparent film having the uniform thickness and formed on the upper surface of the monitoring-mesa structure includes two layers.

8. The surface-emitting laser element according to claim 1, wherein an optically transparent film is layered on a peripheral edge portion of an upper surface of the monitoring-mesa structure.

9. A surface-emitting laser array comprising a plurality of the surface-em laser elements according to claim 1.

10. An optical scanning apparatus for scanning a scanned surface with light, comprising:
    a light source including the surface-emitting laser array according to claim 9;
    a deflector configured to deflect light emitted by the light source; and
    a scanning optical system configured to focus the light deflected by the deflector onto the scanned surface.

11. An optical scanning apparatus for scanning a scanned surface with light, comprising:
    a light source including the surface emitting laser element according to claim 1;
    a deflector configured to deflect light emitted by the light source; and
    a scanning optical system configured to focus the light deflected by the deflector onto the scanned surface.

12. An image forming apparatus comprising:
    an image carrier; and
    the optical scanning apparatus according to claim 11 that is configured to scan the image carrier with light modulated in accordance with image information.

13. The image forming apparatus according to claim 12, wherein the image information includes multicolor image information.

14. A method of manufacturing a surface-emitting laser element comprising a light-emitting mesa structure having an emitting area including a high-reflectance portion and a low-reflectance portion, the method comprising the steps of:
    (a) forming a layered body including a lower reflecting mirror, a cavity structure including an active layer, an upper reflecting mirror having a selectively oxidized layer on a substrate, and a contact layer disposed on the upper reflecting mirror;
    (b) forming a first area on an upper surface of the layered body, in which in the first area an optically transparent film having an optical thickness corresponding to an odd multiple of $\lambda/4$ is partially layered on the contact layer, wherein $\lambda$ is an oscillating wavelength;
    (c) forming a second area having the same size as the first area on the upper surface of the layered body, in which in the second area no optically transparent film is layered on the contact layer;
    (d) etching areas around the first area and the second area from the top of the layered body in order to form a light-emitting mesa structure and a monitoring-mesa structure corresponding to the first area and the second areas respectively, thus exposing at least the selectively oxidized layer on a lateral surface of the light-emitting mesa structure and the monitoring-mesa structure;
    (e) selectively oxidizing the selectively oxidized layer from the lateral surface of the light-emitting mesa structure and the monitoring-mesa structure in order to form a confinement structure in the light-emitting mesa structure and the monitoring-mesa structure, the confinement structure including a current passage area surrounded by an oxide; and
    (f) measuring the size of the current passage area of the monitoring-mesa structure after completion of selective oxidation in (e),
    wherein an upper surface of the light-emitting mesa structure and an upper surface of the monitoring mesa structure are of the same size.

15. The method of manufacturing a surface-emitting laser element according to claim 14, wherein the optically transparent film is layered in an area away from a center of the first area.

16. The method of manufacturing a surface-emitting laser element according to claim 14, further comprising layering another optically transparent film on an upper surface of the first area to an optical thickness corresponding to an even multiple of $\lambda/4$.

* * * * *